United States Patent [19]
Ueda et al.

[11] Patent Number: 5,962,920
[45] Date of Patent: Oct. 5, 1999

[54] SEMICONDUCTOR DEVICE AND A MANUFACTURING METHOD THEREOF

[75] Inventors: Satoshi Ueda; Tetsuya Ueda, both of Osaka; Shuichi Mayumi, Kyoto, all of Japan

[73] Assignee: Matsushita Electric Industrial Co., Ltd., Osaka, Japan

[21] Appl. No.: 08/889,833

[22] Filed: Jul. 8, 1997

[30] Foreign Application Priority Data

Sep. 7, 1996 [JP] Japan .................................. 8-179235

[51] Int. Cl.⁶ ...................................................... H01L 23/58
[52] U.S. Cl. ......................... 257/760; 257/758; 438/624; 438/791
[58] Field of Search ..................................... 438/624, 672, 438/618, 791; 257/760, 758

[56] References Cited

U.S. PATENT DOCUMENTS 5,393,702 2/1995 Yang et al. .
5,545,919 8/1996 Ueda et al. .
5,587,344 12/1996 Ishikawa .
5,643,407 7/1997 Chang .

*Primary Examiner*—Caridad Everhart
*Attorney, Agent, or Firm*—McDermott, Will & Emery

[57] ABSTRACT

A metal wire and a metal electrode which are composed of an aluminum alloy are formed on an interlayer insulating film composed of a silicon oxide film which is formed on the semiconductor substrate. On the entire surface of the metal wire and the metal electrode, a silicon oxide film and a silicon nitride film are formed serially, so as to compose a passivation film. A silicon nitrided-oxide layer is formed by nitriding a silicon oxide film in an area of the silicon oxide film which is the vicinity of the junction of either the metal wire or the metal electrode and the interlayer insulating film.

13 Claims, 19 Drawing Sheets

SEMICONDUCTOR DEVICE AND A MANUFACTURING METHOD THEREOF

BACKGROUND OF THE INVENTION

The present invention relates to the structure of a passivation film in a semiconductor device such as a VLSI and a method of manufacturing the semiconductor device.

In a conventional semiconductor device such as a VLSI, a semiconductor element such as a transistor and metal wires are formed on an interlayer insulating film, and a passivation film is formed on the metal wires for the purpose of preventing the invasion of moisture and impurities such as heavy metals or alkaline metals into the metal wires and the insulating film.

Such a conventional semiconductor device will be described as follows with reference to FIG. 19. As shown in FIG. 19, an interlayer insulating film 12 made from silicon oxide is formed on a semiconductor substrate 11, whereas metal wires 13 and a metal electrode 14 which are made from aluminum or an aluminum alloy that is mainly composed of aluminum are formed on the interlayer insulating film 12. In reality, a semiconductor element such as a transistor is formed on the interlayer insulating film 12; however, it is not illustrated for the sake of convenience of the drawing.

A silicon oxide film 15 and a silicon nitride film 16 are formed on the metal wires 13 and the metal electrode 14 by means of a CVD process or the like. The silicon oxide film 15 and the silicon nitride film 16 compose a passivation film 17. The passivation film 17 has an opening portion 17a on the top surface of the metal electrode 14 so as to conduct a wire-bonding.

In the conventional semiconductor device such as a VLSI, a distance between the metal wires 13 and the distance between the metal wire 13 and the metal electrode 14 become smaller as the device is miniaturized. This causes the following problems.

When the passivation film 17 is deposited by means of the CVD process, the film 17 is overhung at the corners on the top surfaces of the metal wires 13 and the metal electrode 14 because the film 17 becomes thicker at the corners than the other portions. This causes the passivation film 17 to be deposited insufficiently or to suffer pin holes in an area between the metal wires 13 and the area between the metal wire 13 and the metal electrode 14.

When the passivation film 17 is formed thinly or has pin holes, the passivation film 17 may suffer a crack 18 in the vicinity of the junction of either a metal wire 13 or the metal electrode 14 and the interlayer insulating film 12 due to a stress such as a heat treatment after the formation of the passivation film 17. The crack 18 allows entrance of impurities or moisture, which corrode the metal wires 13 and the metal electrode 14, increase the relative permittivity of the interlayer insulating film 12, or decrease the insulation of the interlayer insulating film 12. As a result, the properties and the reliability of the semiconductor device are deteriorated.

In addition, in the vicinity of the junction of either a metal wire 13 or the metal electrode 14 and the interlayer insulating film 12, the passivation film 17 becomes the interface of the film which is deposited on the top surface the interlayer insulating film 12 and the film which is deposited on a side surface of a metal wire 13 or the metal electrode 14, so that the passivation film 17 has a lower density than in the other area. This low-density area, which is the vicinity of the junction of the metal wires 13 or the metal electrode 14 and the interlayer insulating film 12, facilitates the invasion of impurities or moisture into the metal wires 13 and the metal electrode 14, so that the properties and the reliability of the semiconductor device are further deteriorated.

These problems have been so far coped with by enlarging the thickness of the silicon nitride film 16 which is a component of the passivation film 17. However, the thickened silicon nitride film 16 causes the overhangs of the passivation film 17 at the corners on the top surfaces of the metal wires 13 and the metal electrode 14 to get in contact with each other. Thus, it remains unsolved that the thickness of the passivation film 17 is insufficient at the junction of either a metal wire 13 or the metal electrode 14 and the interlayer insulating film 12, and there is a new problem that the capacitance becomes larger if the thickness of the passivation film 17 is enlarged.

SUMMARY OF THE INVENTION

In view of the aforementioned problems, the present invention has an object of preventing the invasion of impurities or moisture into the interlayer insulating film so as to improve the reliability of a semiconductor device, by preventing the deterioration of its properties resulting from the corrosion of the metal wires or the metal electrode, an increase in the relative permittivity of the interlayer insulating film, and a decrease in the insulation of the isolation film.

The first semiconductor device of the present invention comprises an interlayer insulating film which is formed on a semiconductor substrate; a metal wire which is formed on the interlayer insulating film; a passivation film which is composed of a silicon oxide film and a silicon nitride film which are formed serially so as to cover the metal wire; and a silicon nitrided-oxide layer which is selectively formed in an area of the silicon oxide film which is the vicinity of the junction of a side surface of the metal wire and the top surface of the interlayer insulating film.

The silicon oxide film of the passivation film is likely to suffer cracks and has a low density in the vicinity of the junction of a side surface of the metal wire and the top surface of the interlayer insulating films, so that the interlayer insulating film formed below the silicon oxide film is susceptible to impurities or moisture. However, in the first semiconductor device, a silicon nitrided-oxide layer is selectively formed in an area of the silicon oxide film which is the vicinity of the junction of a side surface of the metal wire and the top surface of the interlayer insulating film and works to prevent the invasion of the impurities or moisture into the interlayer insulating film. As a result, it becomes possible to prevent the corrosion of the metal wire formed under the interlayer insulating film, an increase in the relative permittivity of the interlayer insulating film, and a decrease in the insulation of the interlayer insulating film. Thus, the properties of the semiconductor device are prevented from deteriorating and the reliability of the semiconductor device is enhanced.

The second semiconductor device in accordance with the present invention comprises an interlayer insulating film which is composed of a silicon oxide film and formed on a semiconductor substrate; a metal wire which is formed on the interlayer insulating film; a passivation film which is formed so as to cover the metal wire; and a silicon nitrided-oxide layer which is selectively formed in an area of the interlayer insulating film which is the vicinity of the junction of a side surface of the metal wire and the interlayer insulating film.

The passivation film is likely to suffer cracks and has a low density in the vicinity of the junction of a side surface of the metal wire and the top surface of the interlayer insulating film so that the interlayer insulating film below the passivation film is susceptible to impurities or moisture. However, in the second semiconductor device, a silicon nitrided-oxide layer is formed in an area of the interlayer insulating film which is the vicinity of the junction of a side surface of the metal wire and the interlayer insulating film, and works to prevent the invasion of the impurities or moisture into the interlayer insulating film. As a result, it becomes possible to prevent the corrosion of the metal wire formed under the interlayer insulating film, an increase in the relative permittivity of the interlayer insulating film, and a decrease in the insulation of the interlayer insulating film. Thus, the properties of the semiconductor device are prevented from deteriorating and the reliability of the semiconductor device is enhanced.

The third semiconductor device in accordance with the present invention comprises an interlayer insulating film which is composed of a silicon oxide film and formed on a semiconductor substrate; metal wires which are formed on the interlayer insulating film; a passivation film which is formed so as to cover the metal wires and the interlayer insulating film; and a silicon nitrided-oxide layer which is selectively formed in an area of the surface portion of the interlayer insulating film which is between the metal wires.

Since the passivation film is generally formed thinly in an area between the metal wires, impurities or moisture is likely to invade the interlayer insulating film below the passivation film. However, in the third semiconductor device, a silicon nitrided-oxide layer is formed in an area of the surface portion of the interlayer insulating film which is between the metal wires, and works to prevent the invasion of the impurities or moisture into the interlayer insulating film. As a result, the rise in the relative permittivity can be restrained and the invasion of impurities or moisture into the interlayer insulating film can be prevented. Thus, the properties of the semiconductor device are prevented from deteriorating and the reliability of the semiconductor device is enhanced.

The fourth semiconductor device in accordance with the present invention comprises a metal electrode which is formed on a semiconductor substrate; a passivation film which is composed of a silicon oxide film and a silicon nitride film formed serially so as to cover the metal electrode and which has an opening portion on the area where the metal electrode is to be wire-bonded; and a silicon nitrided-oxide layer which is selectively formed in an area of the silicon oxide film which is exposed to the opening portion.

An area of the silicon oxide film of the passivation film which is exposed to the opening portion formed on the metal electrode is generally susceptible to impurities or moisture. However, a silicon nitrided-oxide layer is formed in an area of the silicon oxide film which is exposed to the opening portion formed on the metal electrode, so as to prevent the invasion of impurities or moisture. Consequently, the corrosion of the metal electrode can be prevented, and as a result, the properties of the semiconductor device are prevented from deteriorating and the reliability of the semiconductor device is enhanced.

The fifth semiconductor device in accordance with the present invention comprises an interlayer insulating film which is formed on a semiconductor substrate; a metal wire and a metal electrode which are formed on the interlayer insulating film; a passivation film which is composed of a silicon oxide film and a silicon nitride film formed serially so as to cover the metal wire and the metal electrode, and which has an opening portion on the metal electrode; and a silicon nitrided-oxide layer which is selectively formed in an area of the silicon oxide film which is the vicinity of the junction of a side surface of the metal wire and the top surface of the interlayer insulating film and in an area of the silicon oxide film which is exposed to the opening portion of the silicon oxide film.

The interlayer insulating film under the silicon oxide film of the passivation film, and an area of the silicon oxide film of the passivation film which is exposed to the opening portion formed on the metal electrode are generally susceptible to impurities or moisture. However, in the fifth semiconductor device, a silicon nitrided-oxide layer is formed in an area of the silicon oxide film which is the vicinity of the junction of a side surface of the metal wire and the top surface of the interlayer insulating film and in an area of the silicon oxide film which is exposed to the opening portion of the silicon oxide film. The silicon nitrided-oxide layer works to prevent the invasion of the impurities or moisture into the interlayer insulating film and an area of the silicon oxide film which is exposed to the opening portion of the silicon oxide film. As a result, it becomes possible to prevent the corrosion of the metal wire and the metal electrode, an increase in the relative permittivity of the interlayer insulating film, and a decrease in the insulation of the interlayer insulating film. Thus, the properties of the semiconductor device are prevented from deteriorating and the reliability of the semiconductor device is enhanced.

The first method of manufacturing a semiconductor device in accordance with the present invention comprises the step of forming an interlayer insulating film on a semiconductor substrate; forming a metal wire on the interlayer insulating film; forming a passivation film by depositing a silicon oxide film and a silicon nitride film serially on the metal wire; and forming a silicon nitrided-oxide layer in a self-aligning manner in an area of the silicon oxide film which is the vicinity of the junction of a side surface of the metal wire and the top surface of the interlayer insulating film by subjecting the passivation film to a nitriding treatment.

According to the first method of manufacturing a semiconductor device, the passivation film composed of a silicon oxide film and a silicon nitride film formed on the metal wire is subjected to a nitriding treatment, so that a silicon nitrided-oxide layer is formed in a self-aligning manner, in an area of the silicon oxide film which is the vicinity of the junction of a side surface of the metal wire and the top surface of the interlayer insulating film, that is, an area of the silicon oxide film which is likely to suffer cracks or which has a low density. As a result, it is realized to manufacture the first semiconductor device.

The second method of manufacturing a semiconductor device in accordance with the present invention comprises the steps of forming an interlayer insulating film composed of a silicon oxide film on a semiconductor substrate; forming a metal wire on the interlayer insulating film; forming a passivation film on the metal wire and the interlayer insulating film; and forming a silicon nitrided-oxide layer, in a self-aligning manner, in an area of the interlayer insulating film which is the vicinity of the junction of a side surface of the metal wire and the top surface of the interlayer insulating film, by subjecting the interlayer insulating film to a nitriding treatment.

According to the second method of manufacturing a semiconductor device, after the passivation film is formed on the metal wire and the interlayer insulating film, the interlayer insulating film is subjected to a nitriding treatment. Therefore, a silicon nitrided-oxide layer is formed, in a self-aligning manner, in an area of the interlayer insulating film which is the vicinity of the junction of a side surface of the metal wire and the top surface of the interlayer insulating film, that is, an area which is susceptible to impurities and moisture. As a result, it is realized to manufacture the second semiconductor device.

The third method of manufacturing a semiconductor device in accordance with the present invention comprises the steps of forming an interlayer insulating film composed of a silicon oxide film on a semiconductor substrate; forming metal wires on the interlayer insulating film; forming a silicon nitrided-oxide layer, in a self-aligning manner, in an area of the surface portion of the interlayer insulating film which is between the metal wires, by subjecting the interlayer insulating film to a nitriding treatment; and forming a passivation film on the metal wires and the interlayer insulating film.

According to the third method of manufacturing a semiconductor device, after the metal wires are formed on the interlayer insulating film, the interlayer insulating film is subjected to a nitriding treatment. Therefore, a silicon nitrided-oxide layer is formed, in a self-aligning manner, in an area of the surface portion of the interlayer insulating film which is between the metal wires, that is, an area which is susceptible to impurities and moisture. As a result, it is realized to manufacture the third semiconductor device.

The fourth method of manufacturing a semiconductor device in accordance with the present invention comprises the steps of forming an interlayer insulating film on a semiconductor substrate; forming a metal wire on the interlayer insulating film; depositing a silicon oxide film on the metal wire and the interlayer insulating film; forming a silicon nitrided-oxide layer in the surface portion of the silicon oxide film by subjecting the silicon oxide film to a nitriding treatment; and forming a passivation film which is composed of a silicon oxide film, a silicon nitrided-oxide film, and a silicon nitride film by depositing a silicon nitride film on the silicon nitrided-oxide film layer.

According to the fourth method of manufacturing a semiconductor device, after the silicon nitrided-oxide layer is formed in the surface portion of the silicon oxide film by subjecting the silicon oxide film to a nitriding treatment. As a result, a three-layered passivation layer composed of a silicon oxide film, a silicon nitrided-oxide layer, and a silicon nitride layer is formed. Thus, the silicon nitrided-oxide layer can be formed between the silicon oxide film and the silicon nitride film, which makes it possible to manufacture a semiconductor device in which the silicon nitrided-oxide layer works to prevent the invasion of impurities or moisture into the silicon oxide film and further into the interlayer insulating film under the silicon oxide film.

The fifth method of manufacturing a semiconductor device in accordance with the present invention comprises the steps of forming a metal electrode on a semiconductor substrate; forming a passivation film which is composed of a silicon oxide film and a silicon nitride film by depositing a silicon oxide film and a silicon nitride film serially on the metal electrode; forming an opening portion in an area of the passivation film where the metal electrode is to be wire-bonded; and forming a silicon nitrided-oxide layer, in a self-aligning manner, in an area of the silicon oxide film which is exposed to the opening portion of the silicon oxide film, by subjecting the passivation film to a nitriding treatment.

According to the fifth method of manufacturing a semiconductor device, a passivation film composed of a silicon oxide film and a silicon nitride film which are serially formed on the metal electrode is subjected to a nitriding treatment. Consequently, the silicon nitrided-oxide layer is formed, in a self-aligning manner, in an area of the silicon oxide film which is exposed to the opening portion of the silicon oxide film of the passivation film, that is, an area which is susceptible to impurities or moisture. As a result, it is realized to manufacture the fifth semiconductor device.

The sixth method of manufacturing a semiconductor device in accordance with the present invention comprises the steps of forming an interlayer insulating film on a semiconductor substrate; forming a metal wire and a metal electrode on the interlayer insulating film; forming a passivation film which is composed of a silicon oxide film and a silicon nitride film by depositing a silicon oxide film and a silicon nitride film serially on the metal wire and the metal electrode; forming an opening portion of the passivation film on the metal electrode; and forming a silicon nitrided-oxide layer, in a self-aligning manner, in an area of the silicon oxide film which is the vicinity of the junction of a side surface of the metal wire and the top surface of the interlayer insulating film and in an area of the silicon oxide film which is exposed to the opening portion of the silicon oxide film, by subjecting the passivation film to a nitriding treatment.

According to the sixth method of manufacturing a semiconductor device, a passivation film composed of a silicon oxide film and a silicon nitride film which are formed on the metal wire and the metal electrode is subjected to a nitriding treatment. Consequently, the silicon nitrided-oxide layer is formed, in a self-aligning manner, in an area of the silicon oxide film which is the vicinity of the junction of a side surface of the metal wire and the top surface of the interlayer insulating film, that is, an area which is likely to suffer cracks or which has a low density, that is, an area of the silicon oxide film which is exposed to the opening portion on the metal electrode, that is, an area which is susceptible to impurities or moisture. As a result, it is realized to manufacture the fifth semiconductor device.

In the first to sixth methods of manufacturing a semiconductor device, the nitriding treatment is preferably either a nitrous oxide plasma treatment, a nitride plasma treatment, or ammonia plasma treatment.

DETAILED DESCRIPTION OF THE INVENTION

The semiconductor device in accordance with each embodiment of the present invention and the method of manufacturing the semiconductor device will be described as follows with reference to the drawings.

(Embodiment 1)

Figure 1:
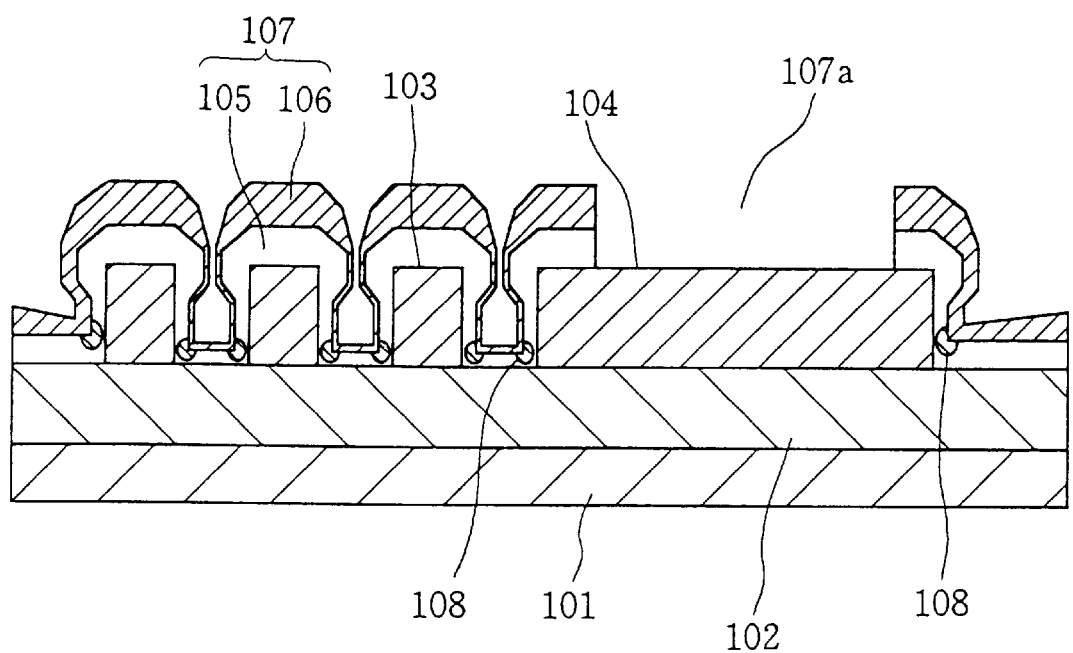
FIG. 1 is a cross section which shows the structure of the semiconductor device in accordance with the first embodiment of the present invention.

FIG. 1 shows a cross section of the semiconductor device in accordance with the first embodiment of the present invention. As shown in FIG. 1, an interlayer insulating film 102 composed of a silicon oxide film is formed on the entire surface of a semiconductor substrate 101. In reality, there is a semiconductor element such as an MOS transistor or an MOS diode on the semiconductor substrate 101, and the interlayer insulating film 102 has an opening portion for electrically connecting the semiconductor element and metal wires 103 which are formed on the interlayer insulating film 102; however, the semiconductor element and the opening portion are omitted in FIG. 1.

On the interlayer insulating film 102, the metal wires 103 which are made of an aluminum alloy and electrically connected with the semiconductor element on the semiconductor substrate 101, and a metal electrode 104 which is to be wire-bonded are formed. A silicon oxide film 105 and a silicon nitride film 106, which compose a passivation film 107, are formed serially on the entire surfaces of the metal wires 103 and the metal electrode 104. The passivation film 107 has an opening portion 107a in the area for wire-bonding.

As the features of the first embodiment, a silicon nitrided-oxide layer 108 formed by nitriding the silicon oxide film 105 which composes the passivation film 107 is formed in an area of the silicon oxide film 105 which is the vicinity of the junction of either a metal wire 103 or the metal electrode 104 and the interlayer insulating film 102.

Figure 18A:
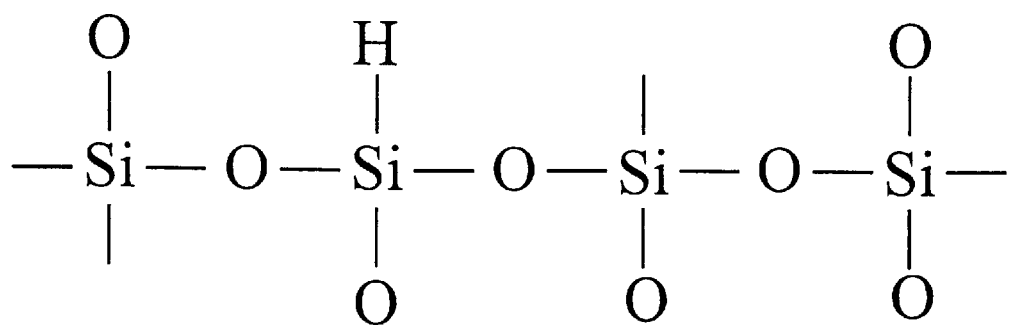
FIGS. 18 (a) and 18 (b) are illustrations used for the description of the nitriding treatment used in the method of manufacturing the semiconductor device in accordance with the first embodiment.
Figure 18B:
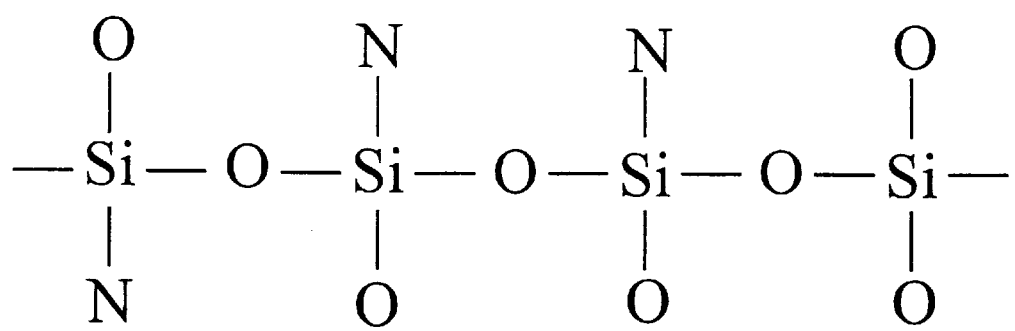
Figure 19:
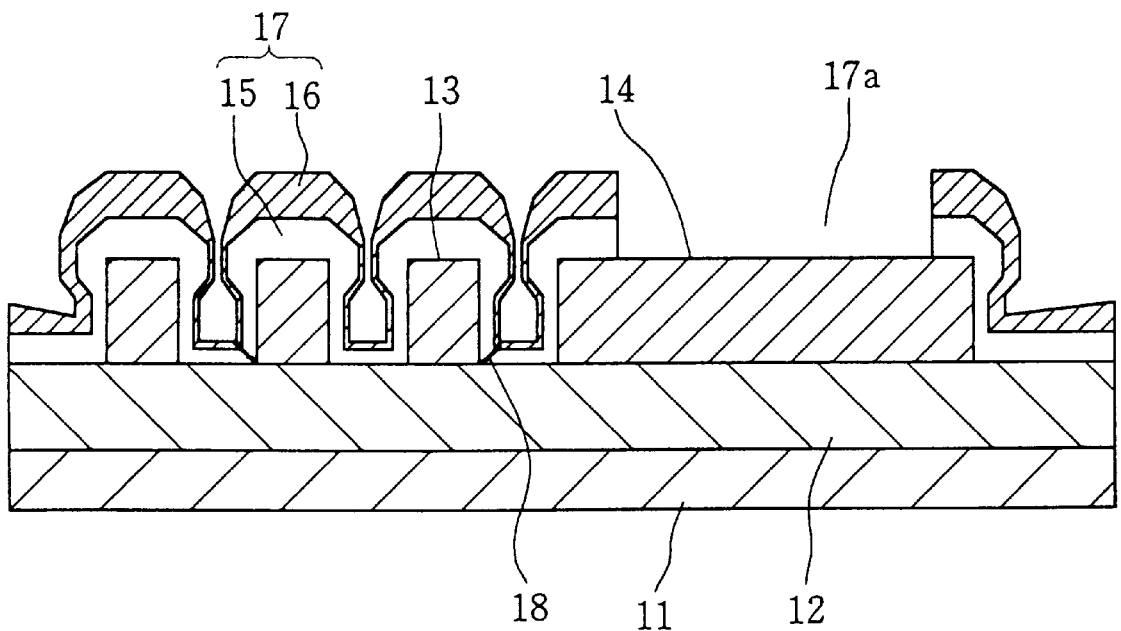
FIG. 19 is a cross section which shows the structure of a conventional semiconductor device.

FIG. 18 (a) shows the molecular structure of the silicon oxide film 105, and FIG. 18 (b) shows the molecular structure of the silicon nitrided-oxide layer 108. In the silicon oxide film 105, especially when it is formed by means of the CVD process with silane gas at a low temperature, the molecular structure includes silicon atoms whose bonds are either combined with an hydrogen atom or not combined with any atom. In the silicon nitrided-oxide layer 108, on the other hand, the hydrogen atom is replaced with a nitrogen atom and the free bond of the silicon atom is combined with a nitrogen atom. Hence, the silicon nitrided-oxide layer 108 has a higher density than the silicon oxide fim 105, and works to prevent the invasion of impurities or moisture into an area of the interlayer insulating film 102 which is the vicinity of the junction of a side surface of either a metal wire 103 or the metal electrode 104 and the interlayer insulating film 102. This makes it possible to prevent the corrosion of the metal wires 103 and the metal electrode 104, an increase in the relative permittivity of the interlayer insulating film 102, and a decrease in the insulation of the interlayer insulating film 102. As a result, the deterioration of the properties of the semiconductor device is prevented and the reliability of the device is improved.

The following is a description of each step of the method of manufacturing the semiconductor device in accordance with the first embodiment of the present invention.

Figure 2A:
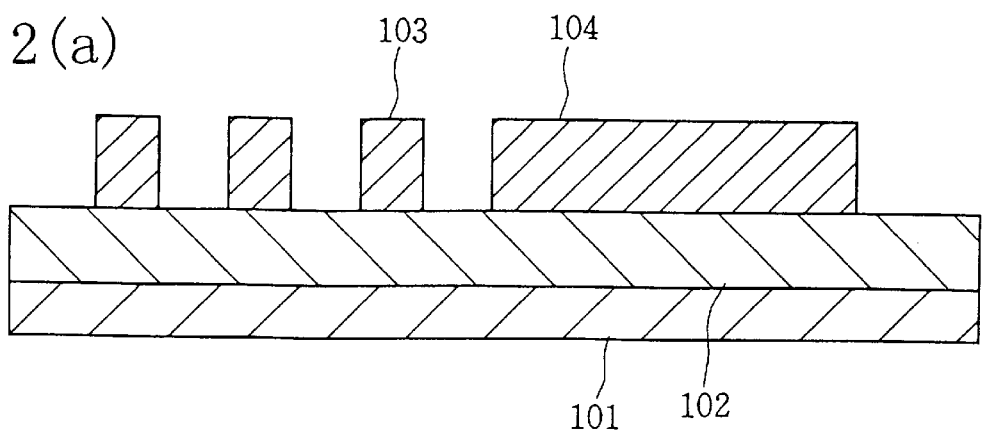
FIGS. 2 (a)–2 (c) are cross sections which show each step of the method of manufacturing the semiconductor device in accordance with the first embodiment.
Figure 2B:
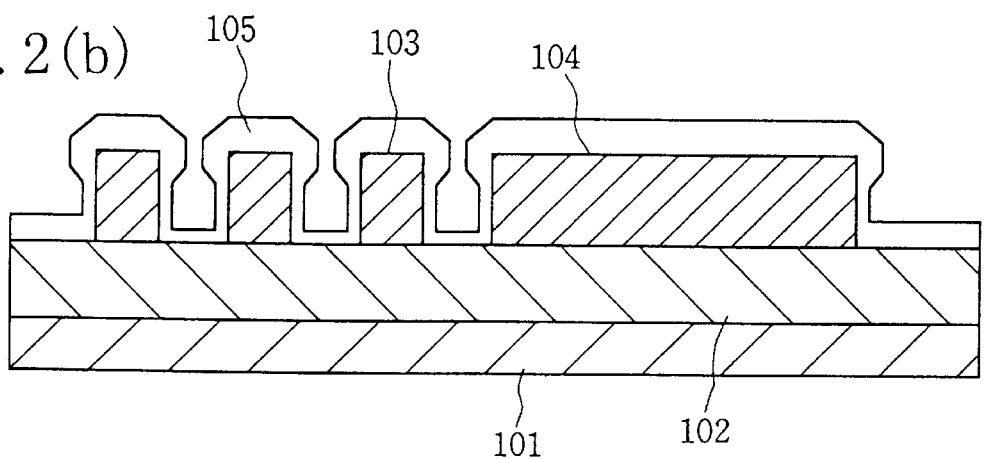
Figure 2C:
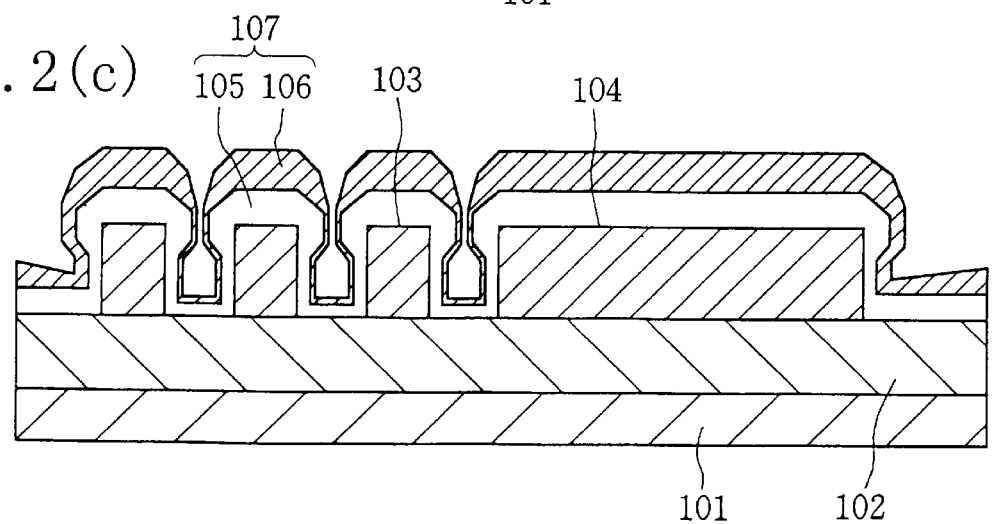

As shown in FIG. 2 (a), the interlayer insulating film 102 composed of a silicon oxide film is deposited by means of the CVD process on the entire surface of the semiconductor substrate 101 which has a semiconductor element such as an MOS transistor or an MOS diode. After this deposition, an unillustrated opening portion is formed on the interlayer insulating film 102 by means of a well-known lithography process and a dry etching process, in order to electrically connect the semiconductor element and the metal wires 103 which to be are formed on the interlayer insulating film 102. Then, the metal wires 103 and the metal electrode 104 both of which are made of an aluminum alloy are formed on the interlayer insulating film 102 by means of the well-known pattering, lithography, and dry etching processes.

After the silicon oxide film 105 is deposited on the entire surfaces of the metal wires 103 and the metal electrode 104 by the CVD process as shown in FIG. 2 (b), a silicon nitride film 106 is deposited on the entire surface of the silicon oxide film 105 by the CVD process as shown in FIG. 2 (c). As a result, the passivation film 107 composed of the silicon oxide film 105 and the silicon nitride film 106 is formed.

Figure 3A:
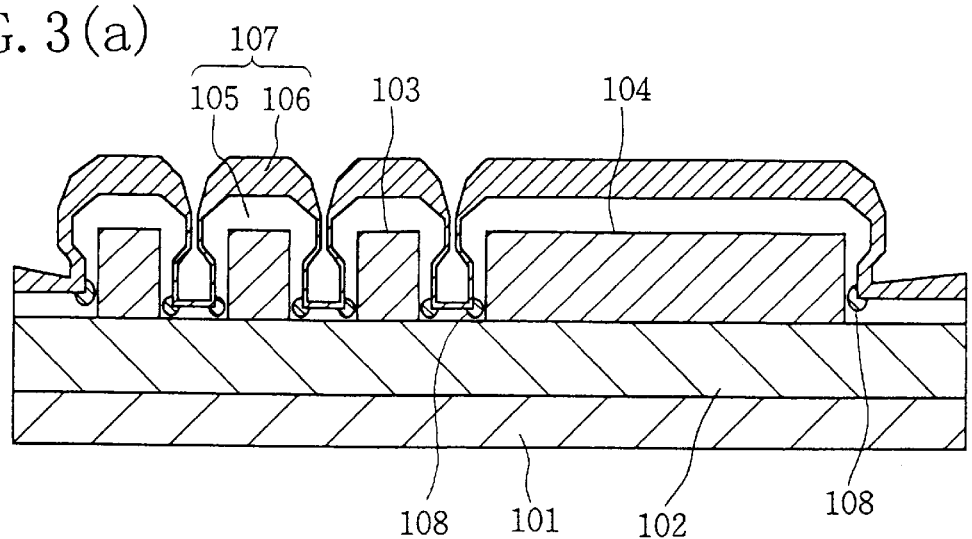
FIGS. 3 (a) and 3 (b) are cross sections which show each step of the method of manufacturing the semiconductor device in accordance with the first embodiment.
Figure 3B:
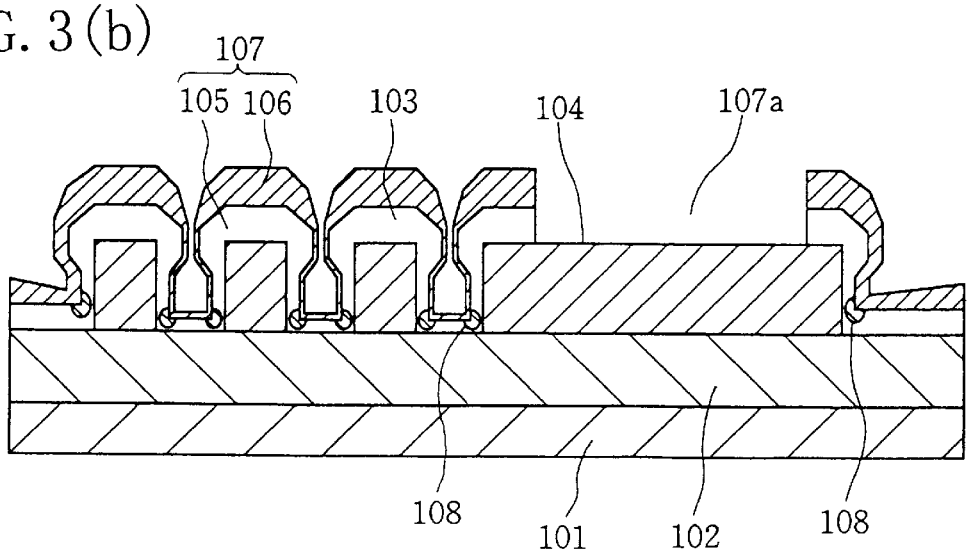

Then, a nitriding treatment is applied to the silicon oxide film 105 from above the silicon nitride film 106, so that the silicon nitrided-oxide layer 108 made by nitriding the silicon oxide film 105 is formed in an area of the silicon oxide film 105 which is the vicinity of the junction of either a metal wire 103 or the metal electrode 104 and the interlayer insulating film 102 as shown in FIG. 3 (a). As the nitriding treatment for forming the silicon nitrided-oxide layer 108, a nitrous oxide plasma treatment can be conducted by providing nitrous oxide (hereinafter referred to as $N_2O$) under the conditions of gas flow rate: 9,500 sccm, temperature: 400° C., RF power: 1,100 W, and pressure: 2.4 Torr.

As shown in FIG. 3 (b), by using the lithography and dry etching processes, the opening portion 107a is formed in the area of the passivation film 107 where the metal electrode 104 is to be wire-bonded.

Figure 4:
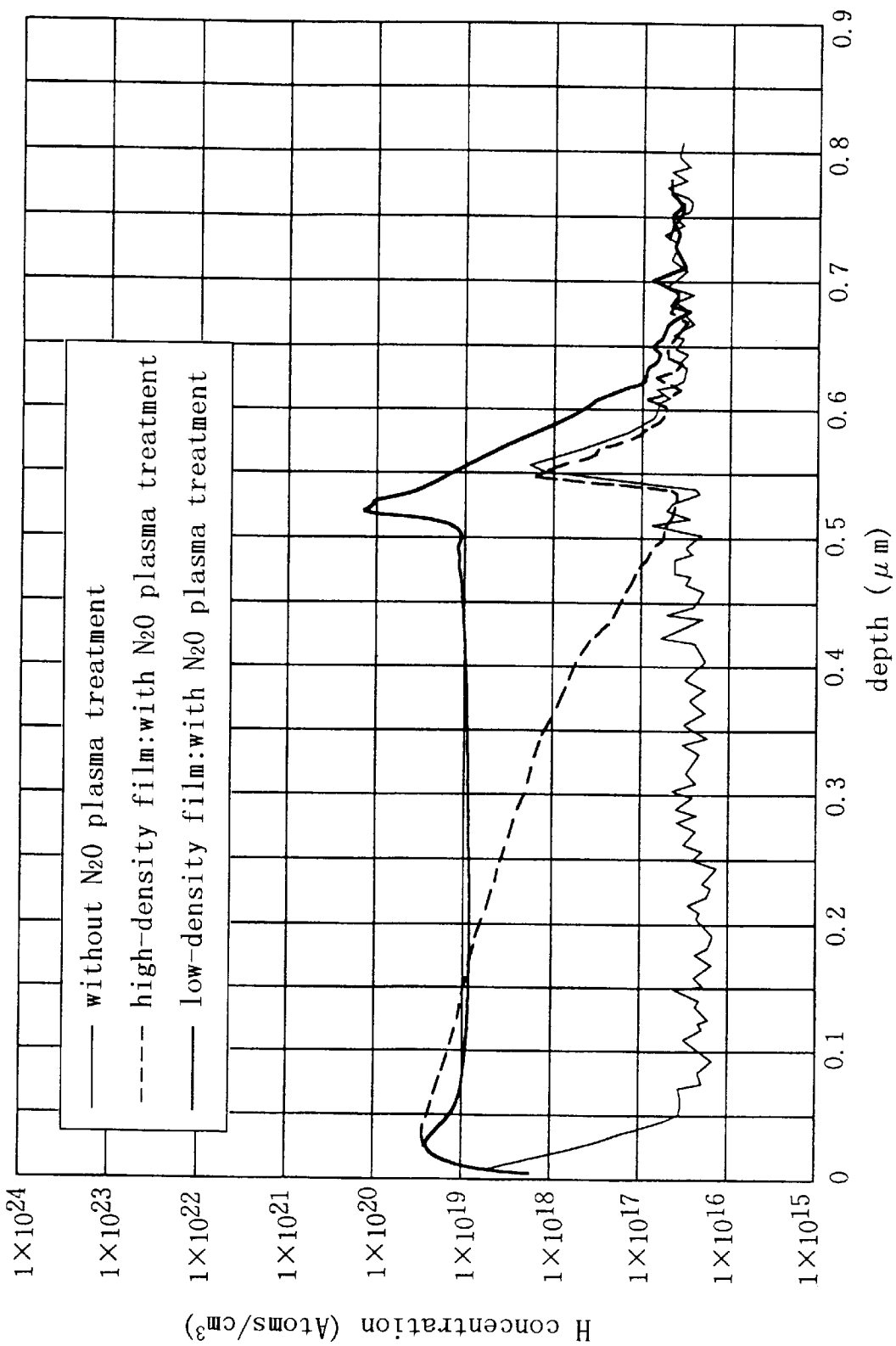
FIG. 4 is a diagram which shows the nitriding treatment used in the method of manufacturing the semiconductor device in accordance with the first embodiment.

FIG. 4 shows the profile of nitrogen concentration in the direction of the depth of the silicon oxide film 105 in the case where the $N_2O$ plasma treatment has been applied to the silicon oxide film 105 and in the case where no $N_2O$ plasma treatment has been conducted. In FIG. 4, the thinner solid line indicates the case where no $N_2O$ plasma treatment has been conducted. The thicker solid line indicates low-density areas in the silicon oxide film 105, such as an area of the silicon oxide film 105 which is the vicinity of the junction of either a metal wire 103 or the metal electrode 104 and the interlayer insulating film 102. The dotted line indicates high-density areas in the silicon oxide film 105 such as an area of the silicon oxide film 105 which is on the top surfaces of the metal wires 103 or the metal electrode 104. As known from FIG. 4, nitrogen atoms are almost evenly distributed between the surface and a depth of 0.5 $\mu$m in the low-density areas in the silicon oxide film 105.

Figure 5:
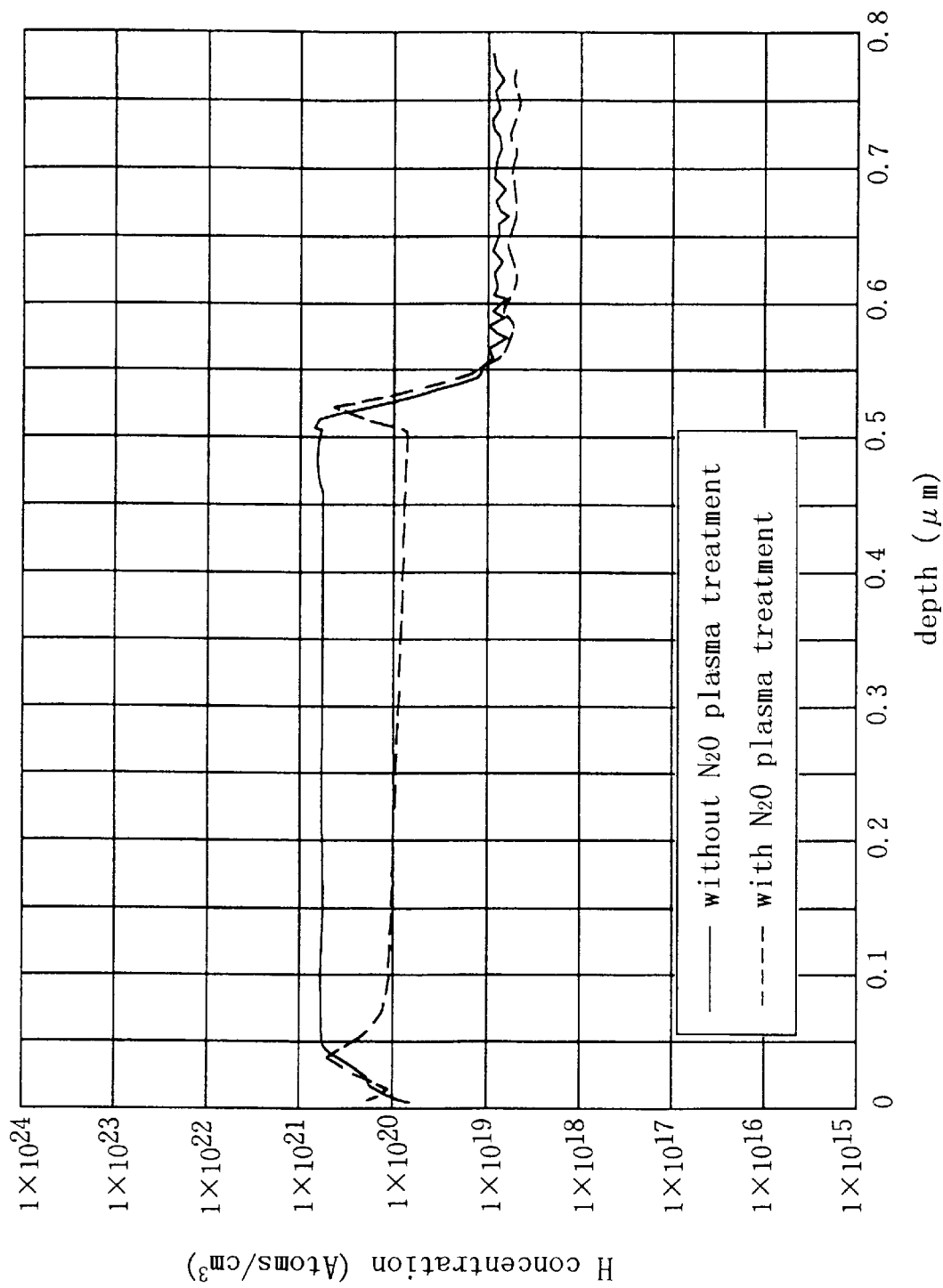
FIG. 5 is a diagram which shows the nitriding treatment used in the method of manufacturing the semiconductor device in accordance with the first embodiment.

FIG. 5 shows the profile of hydrogen concentration in the direction of the depth of the silicon oxide film 105 in the case where the $N_2O$ plasma treatment has been conducted to the silicon oxide film 105 and in the case where no $N_2O$ plasma treatment has been conducted. In FIG. 5, the dotted line indicates the case where the $N_2O$ plasma treatment has been conducted, while the solid line indicates the case where no $N_2O$ plasma treatment has been conducted. As known from FIG. 5, when the $N_2O$ plasma treatment is conducted, the concentration of hydrogen atoms is lower between the surface and a depth of 0.5 $\mu$m than when no $N_2O$ plasma treatment is conducted. The reason for this is considered that the hydrogen atom which is combined with a bond of a silicon atom is replaced by an nitrogen atom.

In the method of manufacturing the semiconductor device in accordance with the first embodiment, the silicon oxide-nitrogen layer 108 can be formed, in a self-aligning manner, in an area which is susceptible to moisture, that is, an area in the silicon oxide film 105 which has a small density or an area in the passivation film 107 which has suffered cracks due to a stress.

Although an aluminum alloy is used as the metal which composes the metal wires 103 and the metal electrode 104 in the first embodiment, another metal such as aluminum, copper, or a copper alloy may be used instead.

Although a silicon oxide film containing no impurity is used as the interlayer insulating film 102 and the silicon oxide film 105 which is a component of the passivation film 107 in the first embodiment, a silicon oxide film containing such an impurity as phosphorous, fluorine, or boron may be used instead.

Although the $N_2O$ plasma treatment is used as the nitriding treatment in the method of manufacturing a semiconductor device in accordance with the first embodiment, a nitrogen plasma treatment, an ammonia plasma treatment, or the like may be used instead.

(Embodiment 2)

Figure 6:
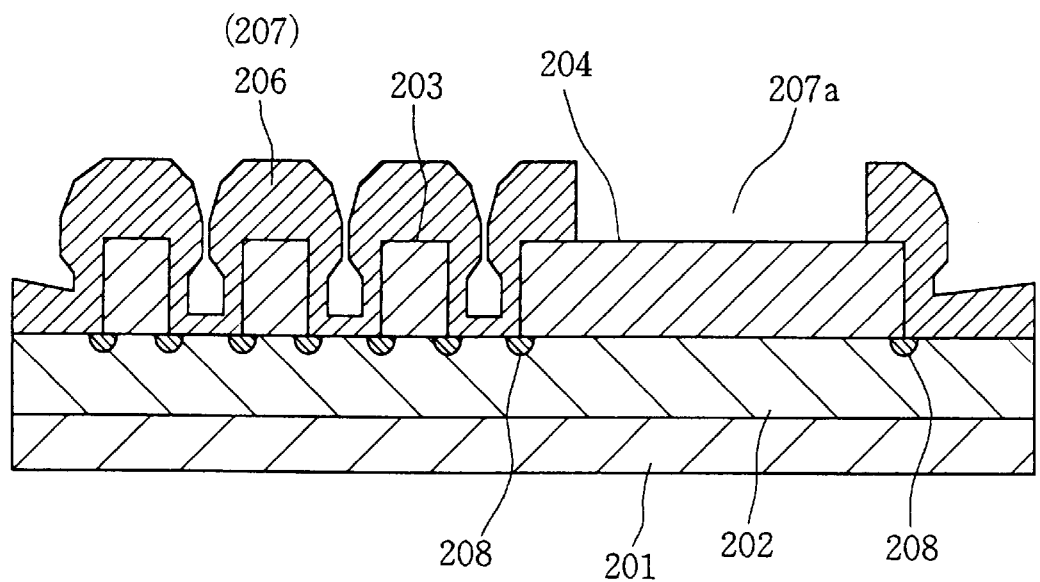
FIG. 6 is a cross section which shows the structure of the semiconductor device in accordance with the second embodiment of the present invention.

FIG. 6 shows a cross section of the semiconductor device in accordance with the second embodiment of the present invention. As shown in FIG. 6, an interlayer insulating film 202 composed of a silicon oxide film is formed on the entire surface of a semiconductor substrate 201. In reality, there is a semiconductor element on the semiconductor substrate 201, and the interlayer insulating film 202 has an opening portion for electrically connecting the semiconductor element and metal wires 203 which are formed on the interlayer insulating film 202; however, the semiconductor element and the opening portion are omitted in FIG. 6.

On the interlayer insulating film 202, the metal wires 203 which are electrically connected with the semiconductor element on the semiconductor substrate 201, and a metal electrode 204 which is to be wire-bonded are formed. A passivation film 207 which is composed of a silicon nitride film 206 is formed on the entire surfaces of the metal wires 203 and the metal electrode 204. The passivation film 207 has an opening portion 207a in the area where the metal electrode 204 is to be wire-bonded.

As the features of the second embodiment, a silicon nitrided-oxide layer 208 made by nitriding the silicon oxide film which composes the interlayer insulating film 202 is formed in an area of the interlayer insulating film 202 which is the vicinity of the junction of either a metal wire 203 or the metal electrode 204 and the interlayer insulating film 202.

As in the first embodiment, the silicon nitrided-oxide layer 208, which has a higher density than the silicon oxide film, works to prevent the invasion of impurities or moisture into an area of the interlayer insulating film 202 which is the vicinity of the junction of either a metal wire 203 or the metal electrode 204 and the interlayer insulating film 202. This makes it possible to prevent the corrosion of the metal wires 203 and the metal electrode 204, an increase in the relative permittivity of the interlayer insulating film 202, and a decrease in the insulation of the interlayer insulating film 202. As a result, the deterioration of the properties of the semiconductor device is prevented and the reliability of the device is improved.

The following is a description of each step of the method of manufacturing the semiconductor device in accordance with the second embodiment of the present invention.

Figure 7A:
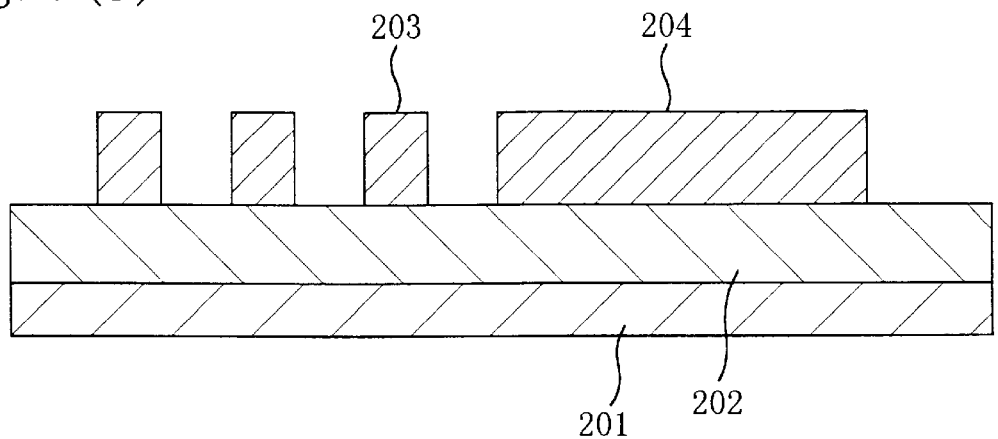
FIGS. 7 (a) and 7 (b) are cross sections which show each step of the method of manufacturing the semiconductor device in accordance with the second embodiment.
Figure 7B:
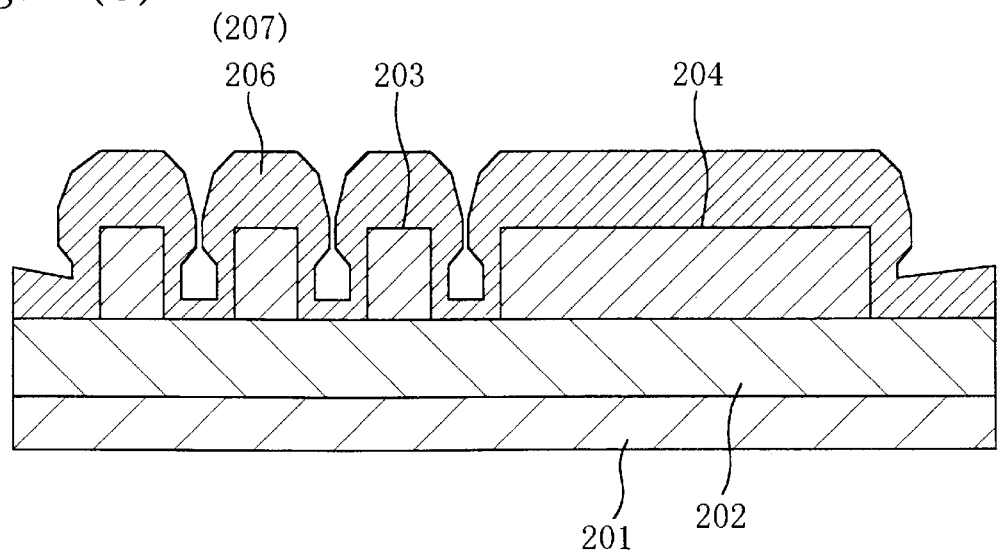

As shown in FIG. 7 (a), the interlayer insulating film 202 composed of a silicon oxide film is deposited by means of the CVD process on the entire surface of the semiconductor substrate 201 which has a semiconductor element such as an MOS transistor or an MOS diode. After this deposition, an unillustrated opening portion is formed on the interlayer insulating film 202 by means of the lithography and dry etching processes, so as to electrically connect the semiconductor element and the metal wires 203 which are formed on the interlayer insulating film 202. Then, the metal wires 203 and the metal electrode 204 both of which are made of an aluminum alloy are formed on the interlayer insulating film 202 by means of the spattering, lithography, and dry etching processes.

The silicon nitride film 206 is deposited on the entire surfaces of the metal wires 203 and the metal electrode 204 by the CVD process as shown in FIG. 7 (b). As a result, the passivation film 207 composed of the silicon nitride film 206 is formed.

Figure 8A:
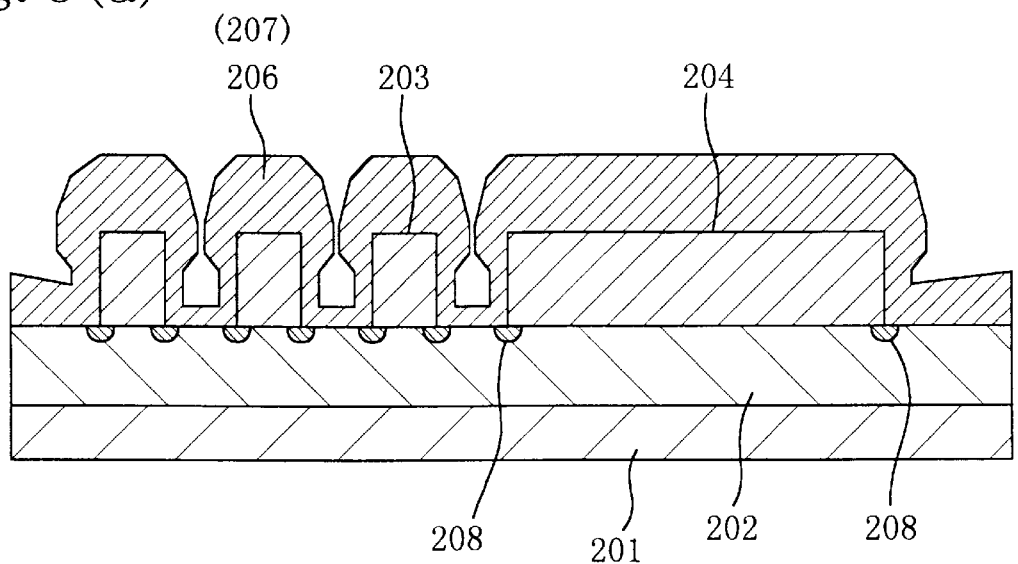
FIGS. 8 (a) and 8 (b) are cross sections which show each step of the method of manufacturing the semiconductor device in accordance with the second embodiment.
Figure 8B:
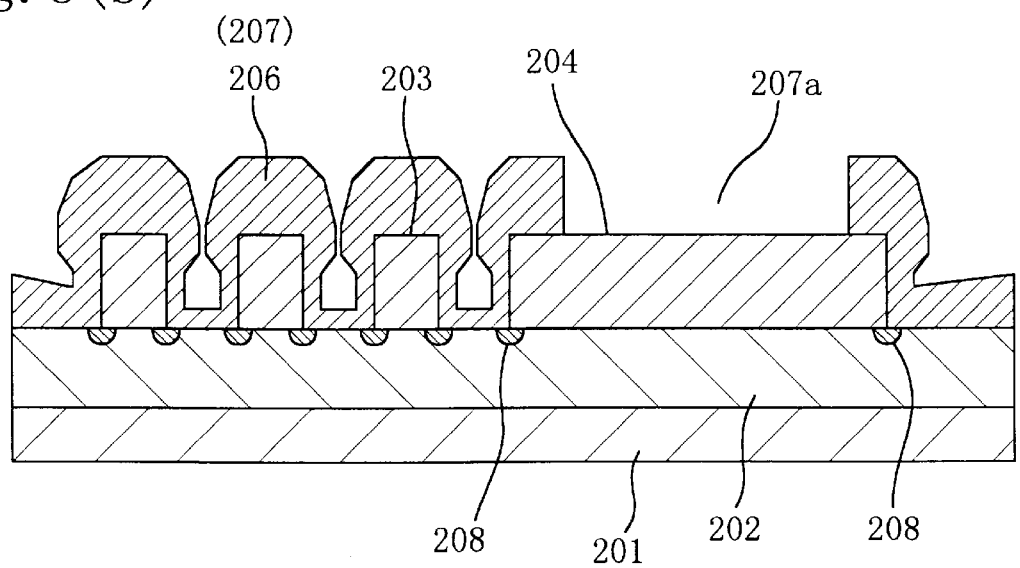

Then, a nitriding treatment is applied to the interlayer insulating film 202 from above the silicon nitride film 206, so that the silicon nitrided-oxide layer 208 made by nitriding the silicon oxide film which composes the interlayer insulating film 202 is formed in an area of the interlayer insulating film 202 which is the vicinity of the junction of either a metal wire 203 or the metal electrode 204 and the interlayer insulating film 202, as shown in FIG. 8 (a). As the nitriding treatment for forming the silicon nitrided-oxide layer 208, the N₂O plasma treatment can be conducted by providing N₂O under the conditions of gas flow rate: 9,500 sccm, temperature: 400° C., RF power: 1,100 W, and pressure: 2.4 Torr.

As shown in FIG. 8 (b), by using the lithography and dry etching processes, the opening portion 207a is formed in the area of the passivation film 207 where the metal electrode 204 is to be wire-bonded.

In the method of manufacturing the semiconductor device in accordance with the second embodiment, the silicon oxide-nitrogen layer 208 can be formed, in a self-aligning manner, in an area of the interlayer insulating film 202 which is susceptible to impurities or moisture, that is, an area of the interlayer insulating film 202 which is the vicinity of the junction of a metal wire 203 or the metal electrode 204 and the interlayer insulating film 202.

Although an aluminum alloy is used as the metal which composes the metal wires 203 and the metal electrode 204 in the second embodiment, another metal such as aluminum, copper, or a copper alloy may be used instead.

Although a silicon oxide film containing no impurity is used as the silicon oxide film which composes the interlayer insulating film 202 in the second embodiment, a silicon oxide film containing such an impurity as phosphorous, fluorine, or boron may be used instead.

(Embodiment 3)

Figure 9:
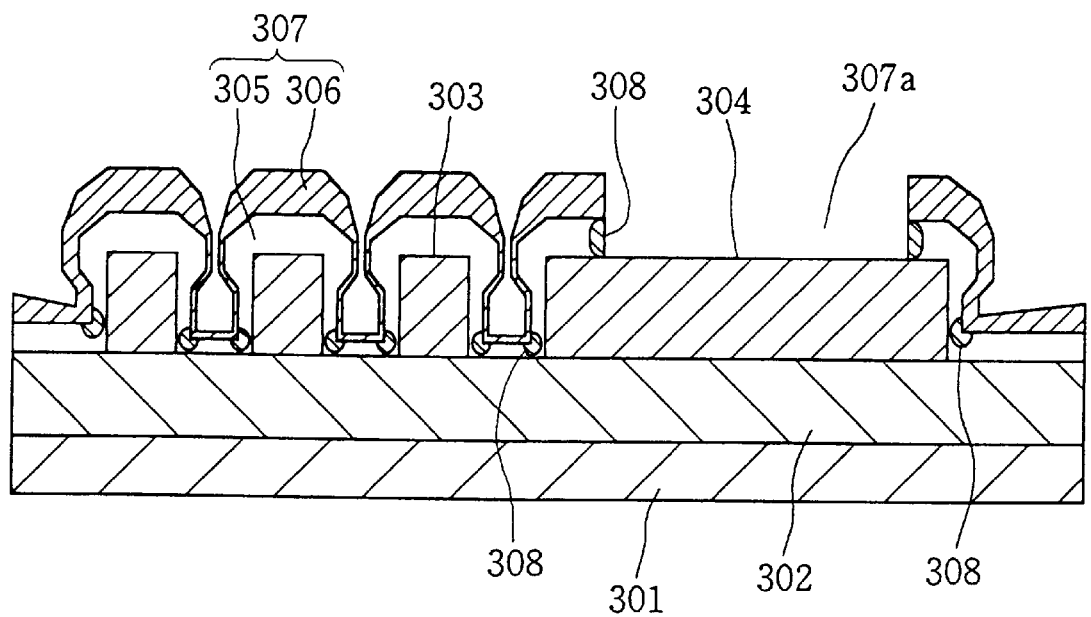
FIG. 9 is a cross section which shows the structure of the semiconductor device in accordance with the third embodiment of the present invention.

FIG. 9 shows a cross section of the semiconductor device in accordance with the third embodiment of the present invention. As shown in FIG. 9, an interlayer insulating film 302 composed of a silicon oxide film is formed on the entire surface of a semiconductor substrate 301. In reality, there is a semiconductor element on the semiconductor substrate 301, and the interlayer insulating film 302 has an opening portion for electrically connecting the semiconductor element and the metal wires 303 which are formed on the interlayer insulating film 302; however, the semiconductor element and the opening portion are omitted in FIG. 9.

On the interlayer insulating film 302, the metal wires 303 which are electrically connected with the semiconductor element on the semiconductor substrate 301, and a metal electrode 304 which is to be wire-bonded are formed. A silicon oxide film 305 and a silicon nitride film 306, which compose a passivation film 307, are formed serially on the entire surfaces of the metal wires 303 and the metal electrode 304. The passivation film 307 has an opening portion 307a in the area where the metal electrode 304 is to be wire-bonded.

As the features of the third embodiment, a silicon nitrided-oxide layer 308 made by nitriding the silicon oxide film 305 is formed in an area of the silicon oxide film 305 composing the passivation film 307 which is the vicinity of the junction of either a side surface of a metal wire 303 or the metal electrode 304 and the interlayer insulating film 302, and in an area of the silicon oxide film 305 which is exposed to the opening portion 307a.

As in the first embodiment, the silicon nitrided-oxide layer 308, which has a higher density than the silicon oxide film 305, works to prevent the invasion of impurities or moisture into an area of the interlayer insulating film 302 which is the vicinity of the junction of a side surface of either a metal wire 303 or the metal electrode 304 and the interlayer insulating film 302 and an area of the interlayer insulating film 302 which is exposed to the opening portion 307a. This makes it possible to prevent the corrosion of the metal wires 303 and the metal electrode 304, an increase in the relative permittivity of the interlayer insulating film 302, and a decrease in the insulation of the interlayer insulating film 302. As a result, the deterioration of the properties of the semiconductor device is prevented and the reliability of the device is improved.

The following is a description of each step of the method of manufacturing the semiconductor device in accordance with the third embodiment of the present invention.

Figure 10A:
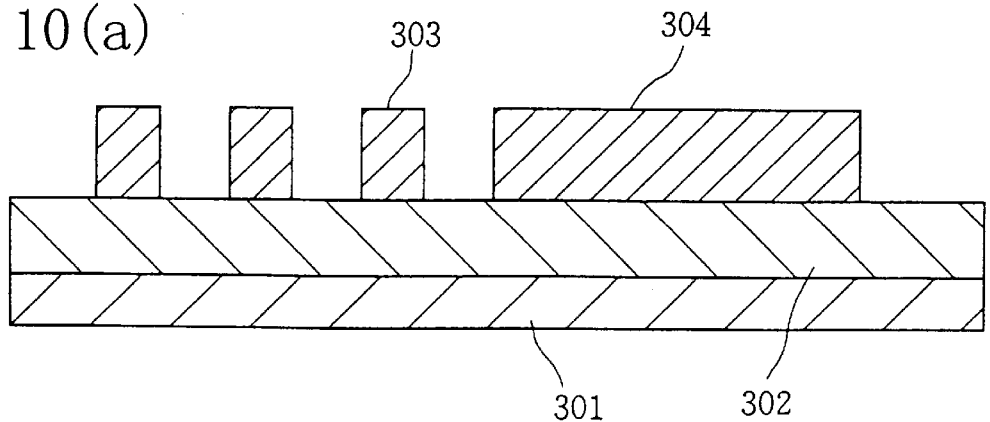
FIGS. 10 (a)–10 (c) are cross sections which show each step of the method of manufacturing the semiconductor device in accordance with the third embodiment.
Figure 10B:
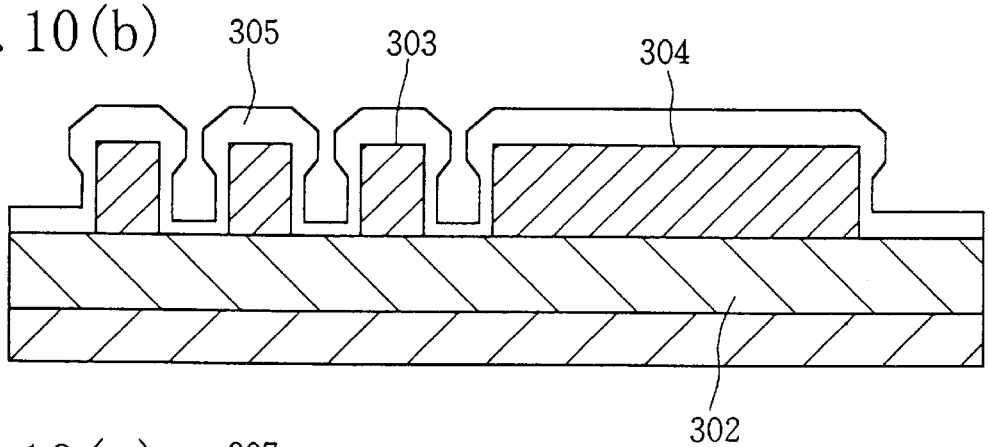
Figure 10C:
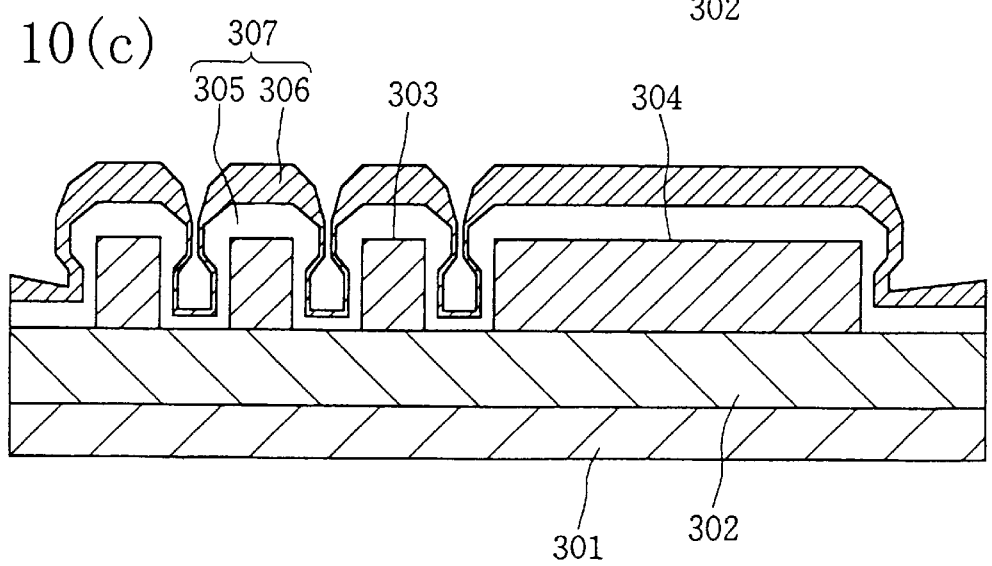

As shown in FIG. 10 (a), the interlayer insulating film 302 composed of a silicon oxide film is deposited by means of the CVD process on the entire surface of the semiconductor substrate 301 which mounts a semiconductor element. After this deposition, an unillustrated opening portion is formed on the interlayer insulating film 302 by means of the lithography and dry etching processes, so as to electrically connect the semiconductor element and the metal wires 303 which are formed on the interlayer insulating film 302. Then, the metal wires 303 and the metal electrode 304 both of which are made from an aluminum alloy are formed on the interlayer insulating film 302 by means of the spattering, lithography, and dry etching processes.

After the silicon oxide film 305 is deposited on the entire surfaces of the metal wires 303 and the metal electrode 304 by the CVD process as shown in FIG. 10 (b), a silicon nitride film 306 is deposited on the entire surface of the silicon oxide film 305 by the CVD process as shown in FIG. 10 (c). As a result, the passivation film 307 composed of the silicon oxide film 305 and the silicon nitride film 306 is formed.

Figure 11A:
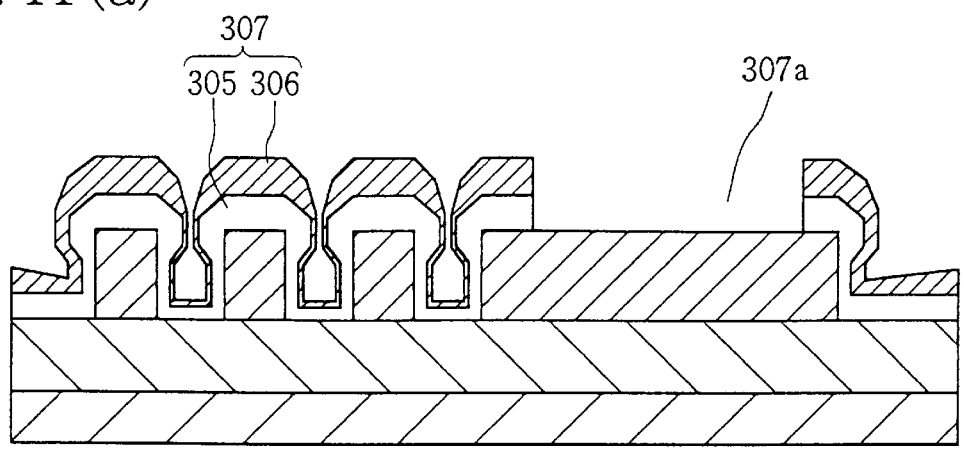
FIGS. 11 (a) and 11 (b) are cross sections which show each step of the method of manufacturing the semiconductor device in accordance with the third embodiment.
Figure 11B:
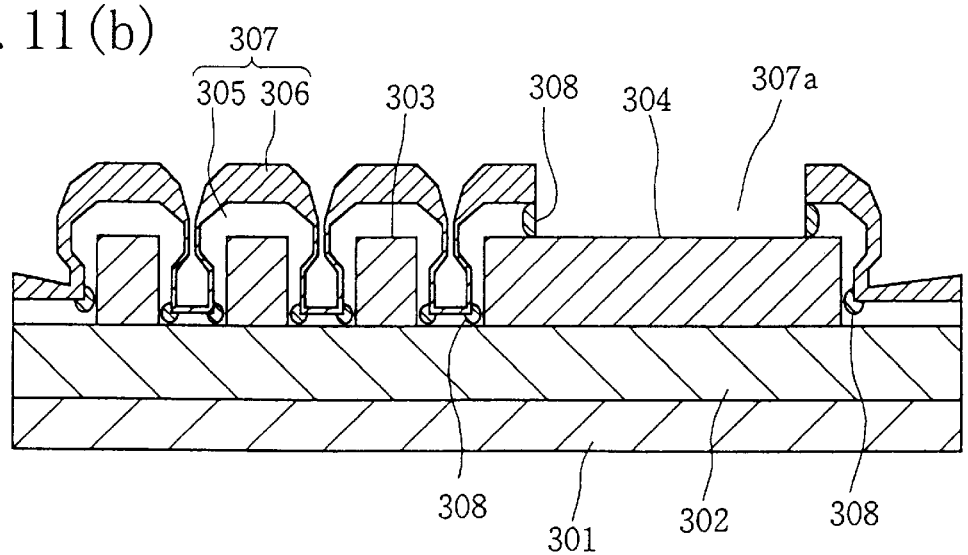

As shown in FIG. 11 (a), by using the spattering, lithography, and dry etching processes, an opening portion 307a is formed in the area of the passivation film 307 where the metal electrode 304 is to be wire-bonded.

Then, a nitriding treatment is applied to the silicon oxide film 305 from above the silicon nitride film 306, so that the silicon nitrided-oxide layer 308 made by nitriding the silicon oxide film 305 is formed in an area of the silicon oxide film 305 which is the vicinity of the junction of a side surface of either a metal wire 303 or the metal electrode 304 and the interlayer insulating film 302, and an area of the silicon oxide film 306 which is exposed to the opening portion 307a, as shown in FIG. 11 (b). As the nitriding treatment for forming the silicon nitrided-oxide layer 308, the N₂O plasma treatment can be conducted by providing N₂O under the conditions of gas flow rate: 9,500 sccm, temperature: 400° C., RF power: 1,100 W, and pressure: 2.4 Torr.

In the method of manufacturing the semiconductor device in accordance with the third embodiment, the silicon oxide-nitrogen layer 308 can be formed, in a self-aligning manner, in an area of the silicon oxide film 305 which is susceptible to moisture, that is, an area of the silicon oxide film 305 which has a small density, an area of the passivation film 307 which has suffered cracks due to a stress, and the exposed portions of the opening portion 307a.

Although an aluminum alloy is used as the metal which composes the metal wires 303 and the metal electrode 304 in the third embodiment, another metal such as aluminum, copper, or a copper alloy may be used instead.

Although a silicon oxide film containing no impurity is used as the interlayer insulating film 302 and the silicon oxide film 305 which is a component of the passivation film 307 in the second embodiment, a silicon oxide film containing such an impurity as phosphorous, fluorine, or boron may be used instead.

Although the N₂O plasma treatment is used as the nitriding treatment in the method of manufacturing a semiconductor device in accordance with the third embodiment, a nitrogen plasma treatment, an ammonia plasma treatment, or the like may be used instead.

(Embodiment 4)

Figure 12:
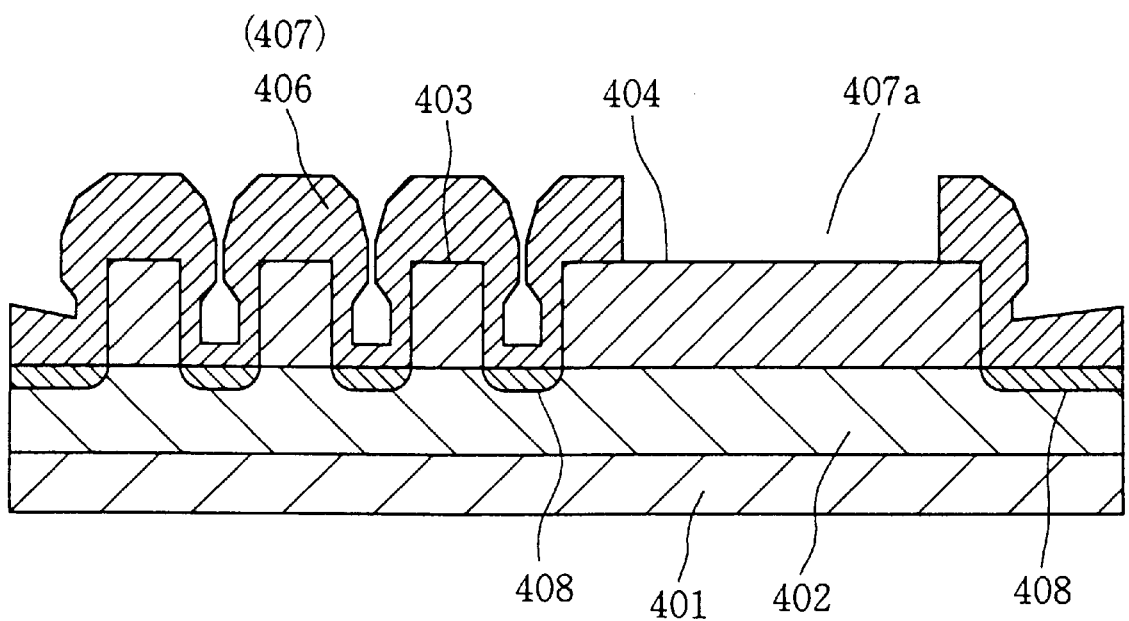
FIG. 12 is a cross section which shows the structure of the semiconductor device in accordance with the fourth embodiment of the present invention.

FIG. 12 shows a cross section of the semiconductor device in accordance with the fourth embodiment of the present invention. As shown in FIG. 12, an interlayer insulating film 402 composed of a silicon oxide film is formed on the entire surface of a semiconductor substrate 401. In reality, there is a semiconductor element on the semiconductor substrate 401, and the interlayer insulating film 402 has an opening portion for electrically connecting the semiconductor element and the metal wires 403 which are formed on the interlayer insulating film 402; however, the semiconductor element and the opening portion are omitted in FIG. 12.

On the interlayer insulating film 402, the metal wires 403 which are made of an aluminum alloy and electrically connected with the semiconductor element on the semiconductor substrate 401, and a metal electrode 404 which is also made of an aluminum alloy and is to be wire-bonded are formed. A passivation film 407 composed of a silicon nitride film 406 is formed on the entire surfaces of the metal wires 403 and the metal electrode 404. The passivation film 407 has an opening portion 407a in the area where the metal electrode 404 is wire-bonded.

As the features of the fourth embodiment, a silicon nitrided-oxide layer 408 made by nitriding the silicon oxide film which composes the interlayer insulating film 402 is formed in areas of the surface of the interlayer insulating film 402, which are between the metal wires 403 and between the metal wire 403 and the metal electrode 404.

As in the first embodiment, the silicon nitrided-oxide layer 408, which has a higher density than the silicon oxide film, works to prevent the invasion of impurities or moisture into the interlayer insulating film 402. In this case, it is possible to form a silicon nitrided-oxide layer on the entire surface of the interlayer insulating film 402; however, this raises the relative permittivity of the interlayer insulating film 402 because the silicon nitrided-oxide layer has a higher relative permittivity than the silicon oxide film. In contrast, when the silicon nitrided-oxide layer 408 is formed selectively in areas of the surface of the interlayer insulating film 402 which are between the metal wires 403 and between the metal wire 403 and the metal electrode 404 as in the fourth embodiment, the rise of the relative permittivity can be restricted and the invasion of moisture into the interlayer insulating film 402 can be prevented.

The following is a description of each step of the method of manufacturing the semiconductor device in accordance with the fourth embodiment of the present invention.

Figure 13A:
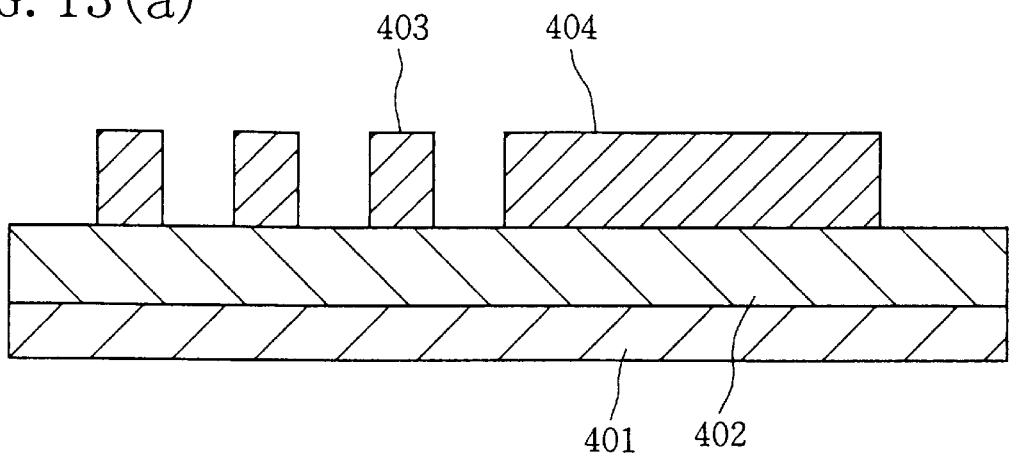
FIGS. 13 (a) and 13 (b) are cross sections which show each step of the method of manufacturing the semiconductor device in accordance with the fourth embodiment.
Figure 13B:
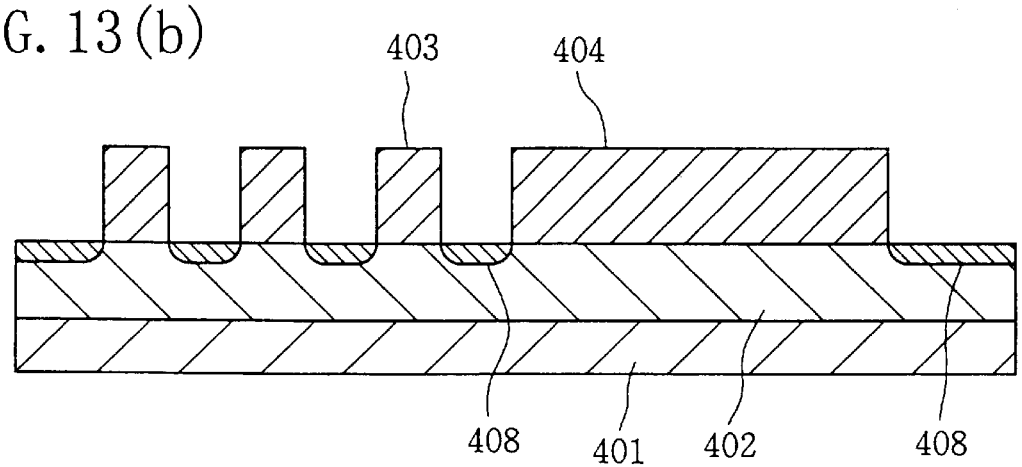

As shown in FIG. 13 (a), the interlayer insulating film 402 composed of a silicon oxide film is deposited by means of the CVD process on the entire surface of the semiconductor substrate 401 which has a semiconductor element. After this deposition, an unillustrated opening portion is formed on the interlayer insulating film 402 by means of the lithography and dry etching processes, so as to electrically connect the semiconductor element and the metal wires 403 which are formed on the interlayer insulating film 402. Then, the metal wires 403 and the metal electrode 404 both of which are made of an aluminum alloy are formed on the interlayer insulating film 402 by means of the spattering, lithography, and dry etching processes.

Then, a nitriding treatment is applied to the silicon oxide film which composes the interlayer insulating film 402, so that the silicon nitrided-oxide layer 408 made by nitriding the silicon oxide film is formed in areas of the surface of the interlayer insulating film 402 which are between the metal wires 403 and between the metal wire 403 and the metal electrode 404 as shown in FIG. 13 (b). As the nitriding treatment for forming the silicon nitrided-oxide layer 408, the $N_2O$ plasma treatment can be conducted by providing $N_2O$ under the conditions of gas flow rate: 9,500 sccm, temperature: 400° C., RF power: 1,100 W, and pressure: 2.4 Torr.

Figure 14A:
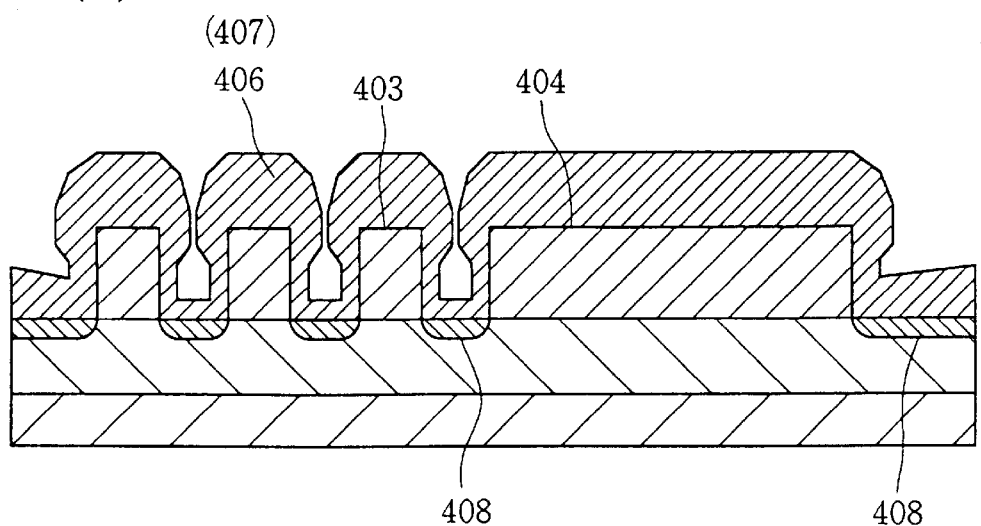
FIGS. 14 (a) and 14 (b) are cross sections which show each step of the method of manufacturing the semiconductor device in accordance with the fourth embodiment.
Figure 14B:
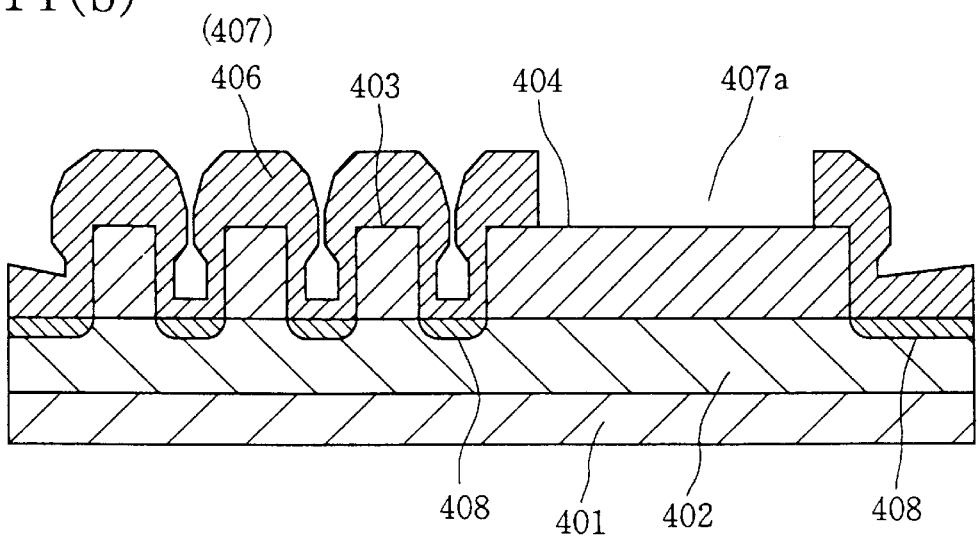

As shown in FIG. 14 (a), a silicon nitride film 406 is formed on the entire surfaces of the metal wires 403 and the metal electrode 404 by means of the CVD process. As a result, a passivation film 407 composed of a silicon nitride film 406 is formed.

As shown in FIG. 14 (b), by using the lithography and dry etching processes, an opening portion 407a is formed in the area of the passivation film 407 where the metal electrode 404 is to be wire-bonded.

In the method of manufacturing the semiconductor device in accordance with the fourth embodiment, the silicon nitrided-oxide layer 408 can be formed, in a self-aligning manner, in an area of the surface of the interlayer insulating film 402 which is susceptible to moisture, that is, an area of the surface of the interlayer insulating film 402 which is in contact with the passivation film 407.

Although an aluminum alloy is used as the metal which composes the metal wires 403 and the metal electrode 404 in the fourth embodiment, another metal such as aluminum, copper, or a copper alloy may be used instead.

Although a silicon oxide film containing no impurity is used as the silicon oxide film which composes the interlayer insulating film 402 in the fourth embodiment, a silicon oxide film containing such an impurity as phosphorous, fluorine, or boron may be used instead.

Although the $N_2O$ plasma treatment is used as the nitriding treatment in the method of manufacturing a semiconductor device in accordance with the fourth embodiment, a nitrogen plasma treatment, an ammonia plasma treatment, or the like may be used instead.

(Embodiment 5)

Figure 15:
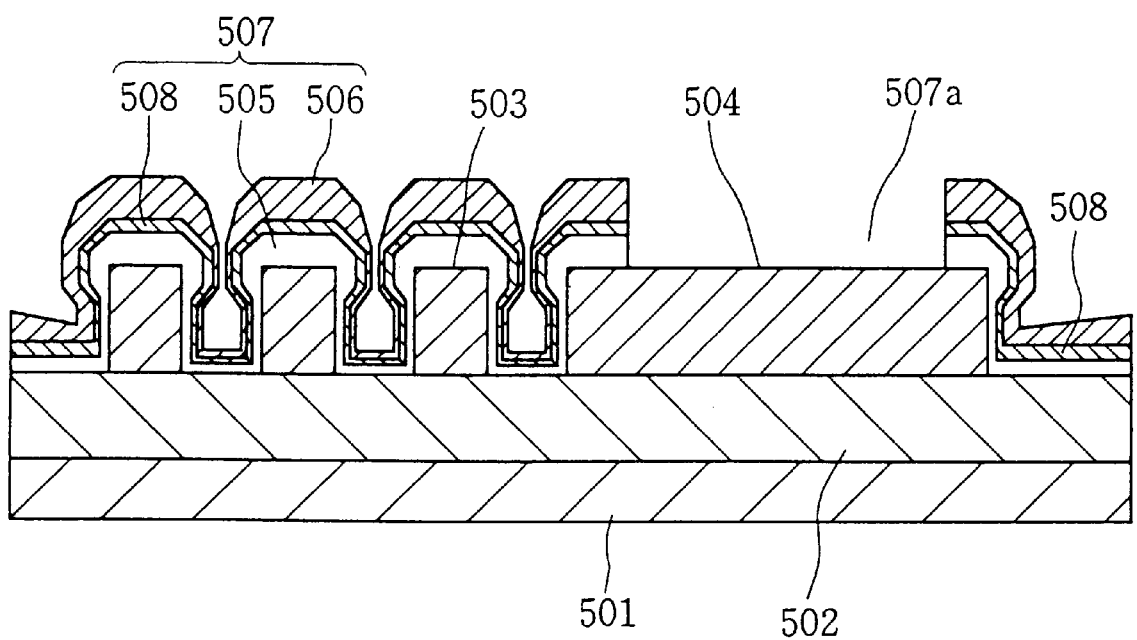
FIG. 15 is a cross section which shows the structure of the semiconductor device in accordance with the fifth embodiment of the present invention.

FIG. 15 shows a cross section of the semiconductor device in accordance with the fifth embodiment of the present invention. As shown in FIG. 15, an interlayer insulating film 502 composed of a silicon oxide film is formed on the entire surface of a semiconductor substrate 501. In reality, there is a semiconductor element on the semiconductor substrate 501, and the interlayer insulating film 502 has an opening portion for electrically connecting the semiconductor element and metal wires 503 which are formed on the interlayer insulating film 502; however, the semiconductor element and the opening portion are omitted in FIG. 15.

On the interlayer insulating film 502, the metal wires 503 which are made from an aluminum alloy and electrically connected with the semiconductor element on the semiconductor substrate 501, and a metal electrode 504 which is also made from an aluminum alloy and wire-bonded are formed.

A silicon oxide film 505, a silicon nitrided-oxide film 508, and a silicon nitride film 506, which compose a passivation film 507, are formed serially on the entire surfaces of the metal wires 503 and the metal electrode 504. The passivation film 507 has an opening portion 507a in the area where the metal electrode 504 is to be wire-bonded.

As the features of the fifth embodiment, the silicon nitrided-oxide layer 508 is formed between the silicon oxide film 505 and the silicon nitride film 506. The silicon nitrided-oxide layer 508, which has a higher density than the silicon oxide film 505, works to prevent the invasion of impurities or moisture into the silicon oxide film 505 and further into the interlayer insulating film 502. This makes it possible to prevent the corrosion of the metal wires 503 and the metal electrode 504, an increase in the relative permittivity of the interlayer insulating film 502, and a decrease in the insulation of the interlayer insulating film 502. As a result, the deterioration of the properties of the semiconductor device is prevented and the reliability of the device is improved.

The following is a description of each step of the method of manufacturing the semiconductor device in accordance with the fifth embodiment of the present invention.

Figure 16A:
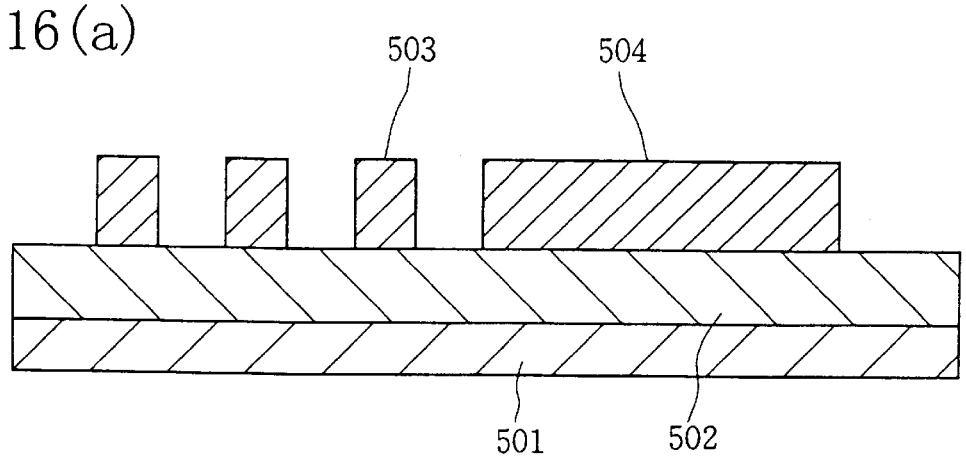
FIGS. 16 (a)–16 (c) are cross sections which show each step of the method of manufacturing the semiconductor device in accordance with the fifth embodiment.
Figure 16B:
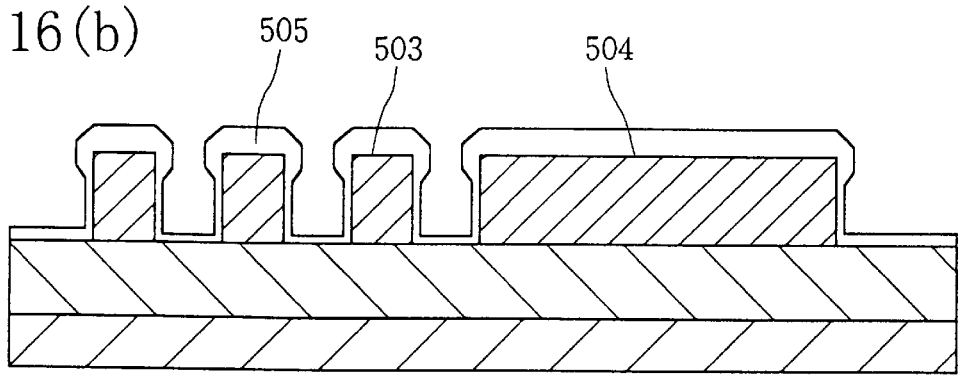
Figure 16C:
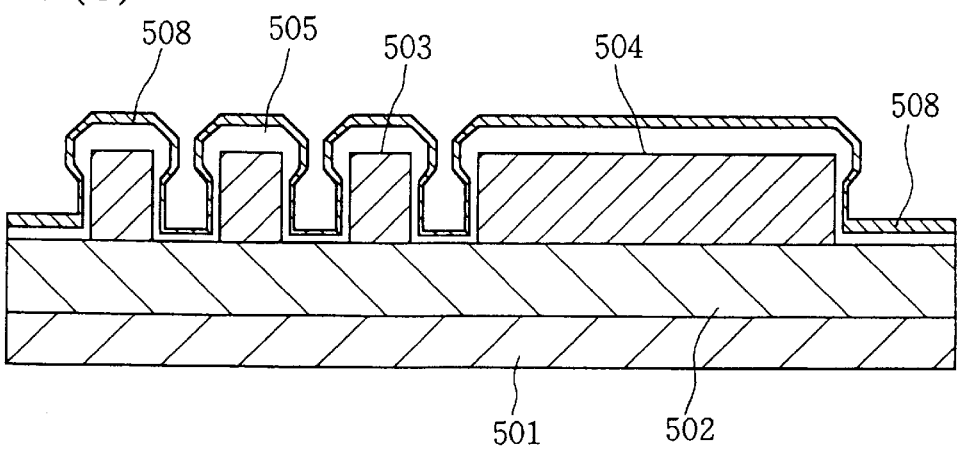

As shown in FIG. 16 (a), the interlayer insulating film 502 composed of a silicon oxide film is deposited by means of the CVD process on the entire surface of the semiconductor substrate 501 which has a semiconductor element. After this deposition, an unillustrated opening portion is formed on the interlayer insulating film 502 by means of the lithography and dry etching processes, so as to electrically connect the semiconductor element and the metal wires 503 which are formed on the interlayer insulating film 502. Then, the metal wires 503 and the metal electrode 504 both of which are made of an aluminum alloy are formed on the interlayer insulating film 502 by means of the spattering, lithography, and dry etching processes.

Then, a silicon oxide film 505 is deposited on the entire surfaces of the metal wires 503 and the metal electrode 504 by means of the CVD process as shown in FIG. 16 (b).

The silicon oxide film 505 is subjected to a nitriding treatment, so that the silicon nitrided-oxide layer 508 is formed on the surface of the silicon oxide film 505 as shown in FIG. 16 (c). As the nitriding treatment for forming the silicon nitrided-oxide layer 508, the $N_2O$ plasma treatment can be conducted by providing $N_2O$ under the conditions of gas flow rate: 9,500 sccm, temperature: 400° C., RF power: 1,100 W, and pressure: 2.4 Torr.

Figure 17A:
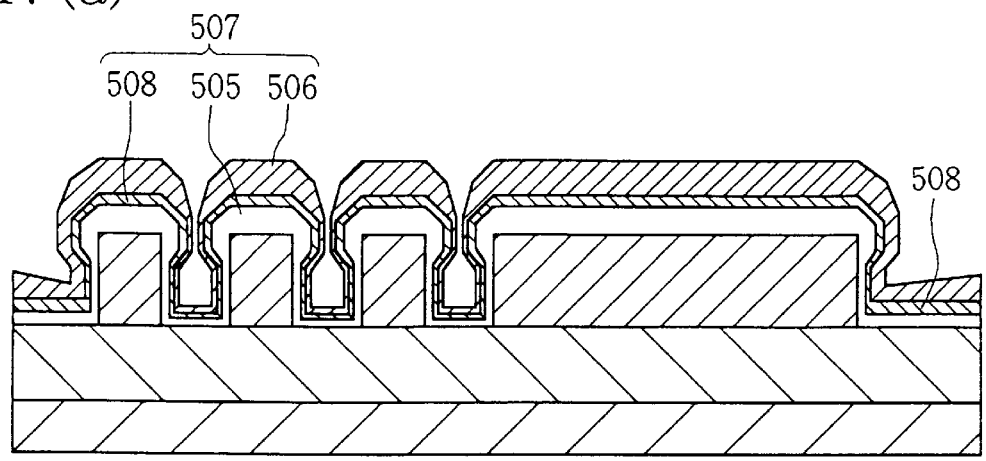
FIGS. 17 (a) and 17 (b) are cross sections which show each step of the method of manufacturing the semiconductor device in accordance with the fifth embodiment.
Figure 17B:
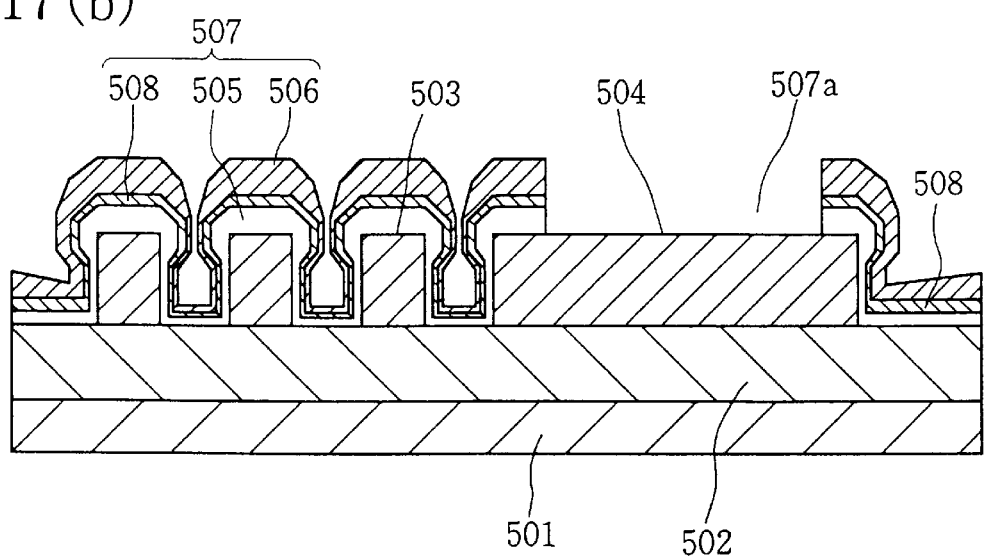

As shown in FIG. 17 (a), the silicon nitride film 506 is formed on the entire surface of the silicon nitrided-oxide film 508 by means of the CVD process.

Then, as shown in FIG. 17 (b), by using the lithography and dry etching processes, an opening portion 507a is formed in the area of the passivation film 507 where the metal electrode 504 is wire-bonded.

In the method of manufacturing the semiconductor device in accordance with the fifth embodiment, the silicon oxide-nitrogen layer 508 can be formed on the surface of the silicon oxide film 505 by subjecting the silicon oxide film 505 to the nitriding treatment.

Even if pin holes are formed when the silicon oxide film 505 is formed, they are restored by the nitriding treatment, which contributes to the improvement of the yield of the semiconductor device.

Although an aluminum alloy is used as the metal which composes the metal wires 503 and the metal electrode 504 in the fifth embodiment, another metal such as aluminum, copper, or a copper alloy may be used instead.

Although a silicon oxide film containing no impurity is used as the silicon oxide film which composes the interlayer insulating film 502 and the interlayer insulating film 505 in the fifth embodiment, a silicon oxide film containing such an impurity as phosphorous, fluorine, or boron may be used instead.

Although the $N_2O$ plasma treatment is used as the nitriding treatment in the method of manufacturing a semiconductor device in accordance with the fifth embodiment, a nitrogen plasma treatment, an ammonia plasma treatment, or the like may be used instead.

What is claimed is:

1. A semiconductor device comprising:

an interlayer insulating film which is formed on a semiconductor substrate;

a metal wire which is formed on said interlayer insulating film;

a passivation film which is composed of a silicon oxide film and a silicon nitride film, said silicon oxide film and said silicon nitride film being formed serially so as to cover said metal wire; and a silicon nitrided-oxide layer which is selectively formed in an area of said silicon oxide film which is a vicinity of a junction of a side surface of said metal wire and a top surface of said interlayer insulating film.

2. A semiconductor device comprising:

an interlayer insulating film which is composed of a silicon oxide film and formed on a semiconductor substrate;

a metal wire which is formed on said interlayer insulating film;

a passivation film which is formed so as to cover said metal wire; and a silicon nitrided-oxide layer which is selectively formed in an area of said interlayer insulating film which is a vicinity of a junction of a side surface of said metal wire and said interlayer insulating film.

3. A semiconductor device comprising:

an interlayer insulating film which is composed of a silicon oxide film and formed on a semiconductor substrate;

metal wires which are formed on said interlayer insulating film;

a passivation film which is formed so as to cover said metal wires and said interlayer insulating film; and a silicon nitrided-oxide layer which is selectively formed in an area of a surface portion of said interlayer insulating film which is between said metal wires.

4. A semiconductor device comprising:

a metal electrode which is formed on a semiconductor substrate;

a passivation film which is composed of a silicon oxide film and a silicon nitride film, and has an opening portion on an area where said metal electrode is to be wire-bonded, said silicon oxide film and said silicon nitride film being formed serially so as to cover said metal wire; and a silicon nitrided-oxide layer which is selectively formed in an area of said silicon oxide film which is exposed to said opening portion.

5. A semiconductor device comprising:

an interlayer insulating film which is formed on a semiconductor substrate;

a metal wire and a metal electrode which are formed on said interlayer insulating film;

a passivation film which is composed of a silicon oxide film and a silicon nitride film, and has an opening portion on said metal electrode, said silicon oxide film and said silicon nitride film being formed serially so as to cover said metal wire and said metal electrode; and a silicon nitrided-oxide layer which is selectively formed in an area of said silicon oxide film which is a vicinity of a junction of a side surface of said metal wire and a top surface of said interlayer insulating film and in an area of said silicon oxide film which is exposed to said opening portion of said silicon oxide film.

6. A method of manufacturing a semiconductor device comprising the steps of:

forming an interlayer insulating film on a semiconductor substrate;

forming a metal wire on said interlayer insulating film;

forming a passivation film by depositing a silicon oxide film and a silicon nitride film serially on said metal wire; and forming a silicon nitrided-oxide layer in a self-aligning manner in an area of said silicon oxide film which is a vicinity of a junction of a side surface of said metal wire and a top surface of said interlayer insulating film by subjecting said passivation film to a nitriding treatment.

7. The method of manufacturing a semiconductor device according to claim 6, wherein said nitriding treatment is one of a nitrous oxide plasma treatment, a nitrogen plasma treatment and an ammonia plasma treatment.

8. A method of manufacturing a semiconductor device comprising the steps of:

forming an interlayer insulating film on a semiconductor substrate, said interlayer insulating film being composed of a silicon oxide film;

forming a metal wire on said interlayer insulating film;

forming a passivation film on said metal wire and said interlayer insulating film; and forming a silicon nitrided-oxide layer, in a self-aligning manner, in an area of said interlayer insulating film which is a vicinity of a junction of a side surface of said metal wire and said interlayer insulating film, by subjecting said interlayer insulating film to a nitriding treatment.

9. The method of manufacturing a semiconductor device according to claim 8, wherein said nitriding treatment is one of a nitrous oxide plasma treatment, a nitrogen plasma treatment and an ammonia plasma treatment.

10. A method of manufacturing a semiconductor device comprising the steps of:

forming an interlayer insulating film on a semiconductor substrate, said interlayer insulating film being composed of a silicon oxide film;

forming metal wires on said interlayer insulating film;

forming a silicon nitrided-oxide layer, in a self-aligning manner, in an area of a surface portion of said interlayer insulating film which is between said metal wires, by subjecting said interlayer insulating film to a nitriding treatment; and forming a passivation film on said metal wires and said interlayer insulating film.

11. A method of manufacturing a semiconductor device comprising the steps of:

forming an interlayer insulating film on a semiconductor substrate;

forming a metal wire on said interlayer insulating film;

depositing a silicon oxide film on said metal wire and said interlayer insulating film;

forming a silicon nitrided-oxide layer in a surface portion of said silicon oxide film by subjecting said silicon oxide film to a nitriding treatment; and forming a passivation film which is composed of a silicon oxide film, a silicon nitrided-oxide film, and a silicon nitride film by depositing a silicon nitride film on said silicon nitrided-oxide film layer.

12. A method of manufacturing a semiconductor device comprising the steps of:

forming a metal electrode on a semiconductor substrate;

forming a passivation film which is composed of a silicon oxide film and a silicon nitride film by depositing a silicon oxide film and a silicon nitride film serially on said metal electrode;

forming an opening portion in an area of said passivation film where said metal electrode is to be wire-bonded; and forming a silicon nitrided-oxide layer, in a self-aligning manner, in an area of said silicon oxide film which is exposed to said opening portion of said silicon oxide film, by subjecting said passivation film to a nitriding treatment.

13. The method of manufacturing a semiconductor device comprising the steps of:

forming an interlayer insulating film on a semiconductor substrate;

forming a metal wire and a metal electrode on said interlayer insulating film;

forming a passivation film which is composed of a silicon oxide film and a silicon nitride film by depositing a silicon oxide film and a silicon nitride film serially on said metal wire and said metal electrode;

forming an opening portion of said passivation film on said metal electrode; and forming a silicon nitrided-oxide layer, in a self-aligning manner, in an area of said silicon oxide film which is a vicinity of a junction of a side surface of said metal wire and a top surface of said interlayer insulating film and in an area of said silicon oxide film which is exposed to said opening portion, by subjecting said passivation film to a nitriding treatment.

* * * * *

UNITED STATES PATENT AND TRADEMARK OFFICE
CERTIFICATE OF CORRECTION

PATENT NO. : 5,962,920
DATED : October 5, 1999
INVENTOR(S) : Ueda, et. al.

It is certified that error appears in the above-identified patent and that said Letters Patent is hereby corrected as shown below:

Title page, item [30], under Foreign Application Priority Data, change Sept. 7, 1996 to July 9, 1996

Signed and Sealed this

Twenty-fifth Day of July, 2000

Attest:

Q. TODD DICKINSON

Attesting Officer

Director of Patents and Trademarks